(12) United States Patent
Houlihan et al.

(10) Patent No.: US 7,537,879 B2
(45) Date of Patent: May 26, 2009

(54) PHOTORESIST COMPOSITION FOR DEEP UV AND PROCESS THEREOF

(75) Inventors: Francis M. Houlihan, Millington, NJ (US); Ralph R. Dammel, Flemington, NJ (US); Andrew R. Romano, Pittstown, NJ (US); Munirathna Padmanaban, Bridgewater, NJ (US); M. Dalil Rahman, Flemington, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 10/994,745

(22) Filed: Nov. 22, 2004

(65) Prior Publication Data

US 2006/0110677 A1 May 25, 2006

(51) Int. Cl.
*G03F 7/039* (2006.01)
*G03F 7/20* (2006.01)
*G03F 7/30* (2006.01)
*G03F 7/38* (2006.01)
*G03C 1/73* (2006.01)

(52) U.S. Cl. .................. 430/270.1; 430/905; 430/910; 430/326; 430/330; 430/331; 526/256; 526/286

(58) Field of Classification Search ....................... None
See application file for complete search history.

(56) References Cited

U.S. PATENT DOCUMENTS

| | | | |
|---|---|---|---|
| 4,491,628 A | 1/1985 | Ito et al. | |
| 5,350,660 A | 9/1994 | Urano et al. | |
| 5,843,624 A | 12/1998 | Houlihan et al. | |
| 6,274,286 B1 | 8/2001 | Hatakeyama et al. | |
| 6,447,980 B1 | 9/2002 | Rahman et al. | |
| 6,919,161 B2 * | 7/2005 | Hatakeyama et al. | .... 430/270.1 |
| 2001/0044070 A1 | 11/2001 | Uetani et al. | |
| 2003/0215740 A1 * | 11/2003 | Harada et al. | ............. 430/270.1 |
| 2003/0219678 A1 * | 11/2003 | Harada et al. | |
| 2003/0232277 A1 * | 12/2003 | Sasaki et al. | ............. 430/270.1 |
| 2004/0013980 A1 | 1/2004 | Hatakeyama et al. | |
| 2005/0026073 A1 * | 2/2005 | Sasaki | ..................... 430/270.1 |
| 2005/0069808 A1 * | 3/2005 | Mizutani | ................. 430/270.1 |
| 2006/0160032 A1 * | 7/2006 | Endo et al. | ................... 430/322 |

OTHER PUBLICATIONS

CA DN 106:42135.*
CA DN 125:59973.*
Jung et al., "Design of cycloolefin-maleic anhydride resist for ArF lithography", SPIE vol. 3333, pp. 11 - pp. 25 (1998)—15 Pages.
Nakano et al., "Adhesion Characteristics of Alicyclic Polymers for use in ArF Excimer Laser Lithography", SPIE vol. 3333, pp. 43 - pp. 52 (1998)—10 Pages.
Nozaki et al., "A novel polymer for 193-nm resist", Journal of Photopolymer Science and Technology, vol. 9, No. 3, pp. 509 - pp. 522 (1996)—14 Pages.
Nozaki et al., "Evaluation of alicyclic Methacrylate Resist with a -Butyrolactone protective Group for 193-nm Lithography", Journal of Photopolymer Science and Technology, vol. 11, No. 3, pp. 493 - pp. 498 (1998)—6 Pages.
Switkes et al., "Immersion Liquids for Lithography in Deep Ultraviolet", SPIE vol. 5040, pp. 690-694 (2003)—5 Pages.
Wallow et al., "Reactive ion etching of 193 nm resist candidates: current platforms, future requirements", SPIE vol. 3333, pp. 92 - pp. 101 (1998)—10 Pages.
Notice Concerning Transmittal of International Preliminary Report on Patentability (Chapter 1 of the Patent Cooperation Treaty) (Form PCT/IB/326,) and International Preliminary Report of Patentability (Form PCT/IB/373), for PCT/IB2005/003517.

* cited by examiner

*Primary Examiner*—Sin J. Lee
(74) *Attorney, Agent, or Firm*—Sangya Jain

(57) ABSTRACT

The present invention relates to a novel chemically amplified photoresist, which is sensitive to wavelengths between 300 nm and 100 nm, and comprises a) a novel polymer comprising a sulfone group pendant from a polymer backbone that is insoluble in an aqueous alkaline solution and comprises at least one acidic moiety protected with acid labile group, and b) a compound capable of producing an acid upon irradiation. The invention also relates to a process of imaging the novel positive photoresist composition.

20 Claims, 11 Drawing Sheets

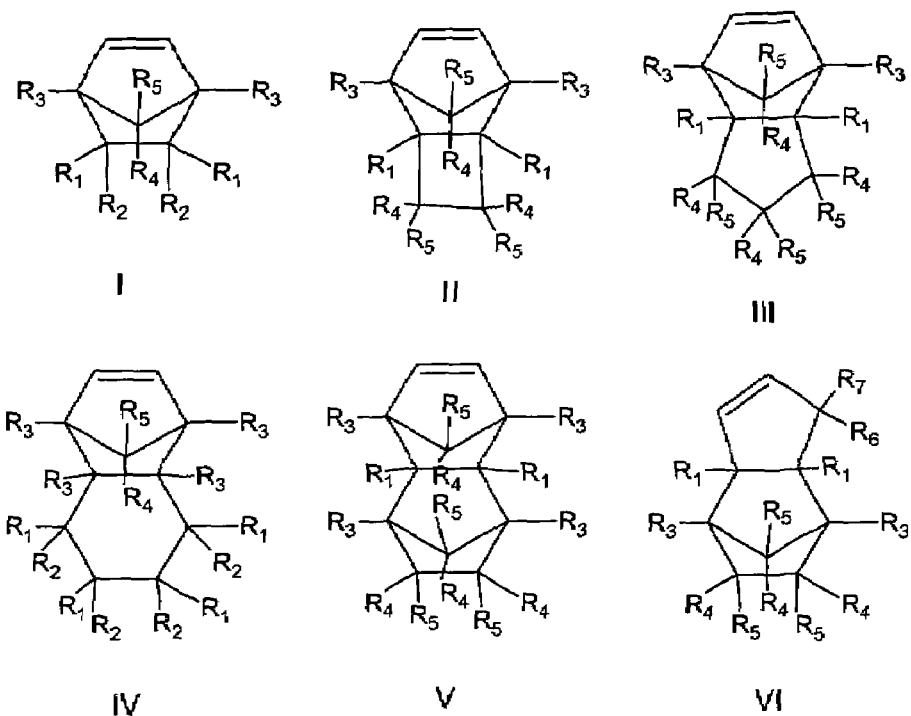
Figure 1: Generic structures for the norbornene-based monomer
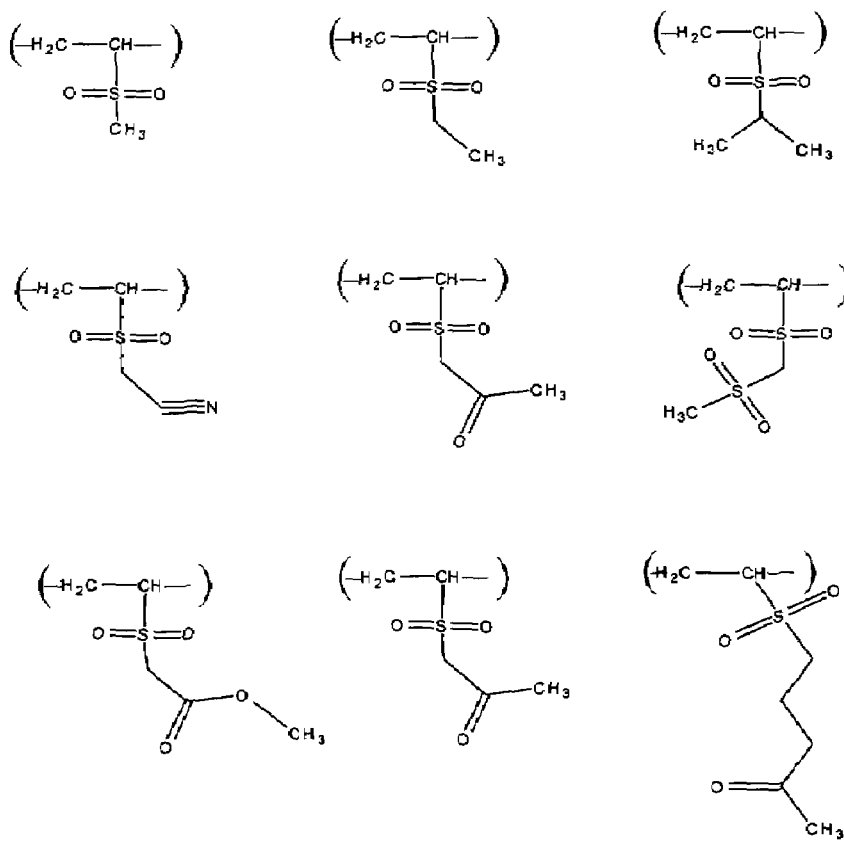
Figure 2: Examples of sulfone monomers

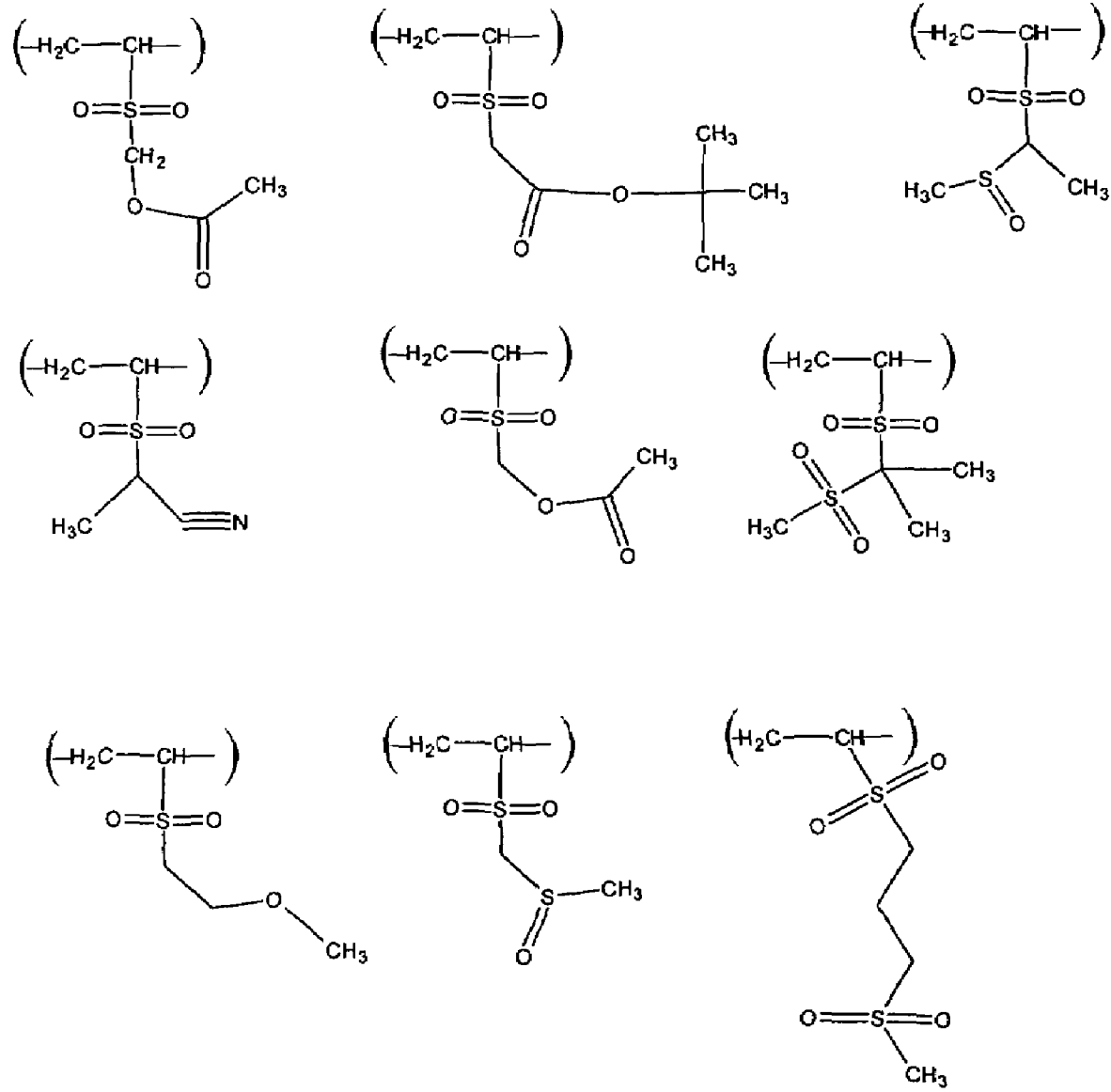
Figure 3: Further examples of sulfone monomers

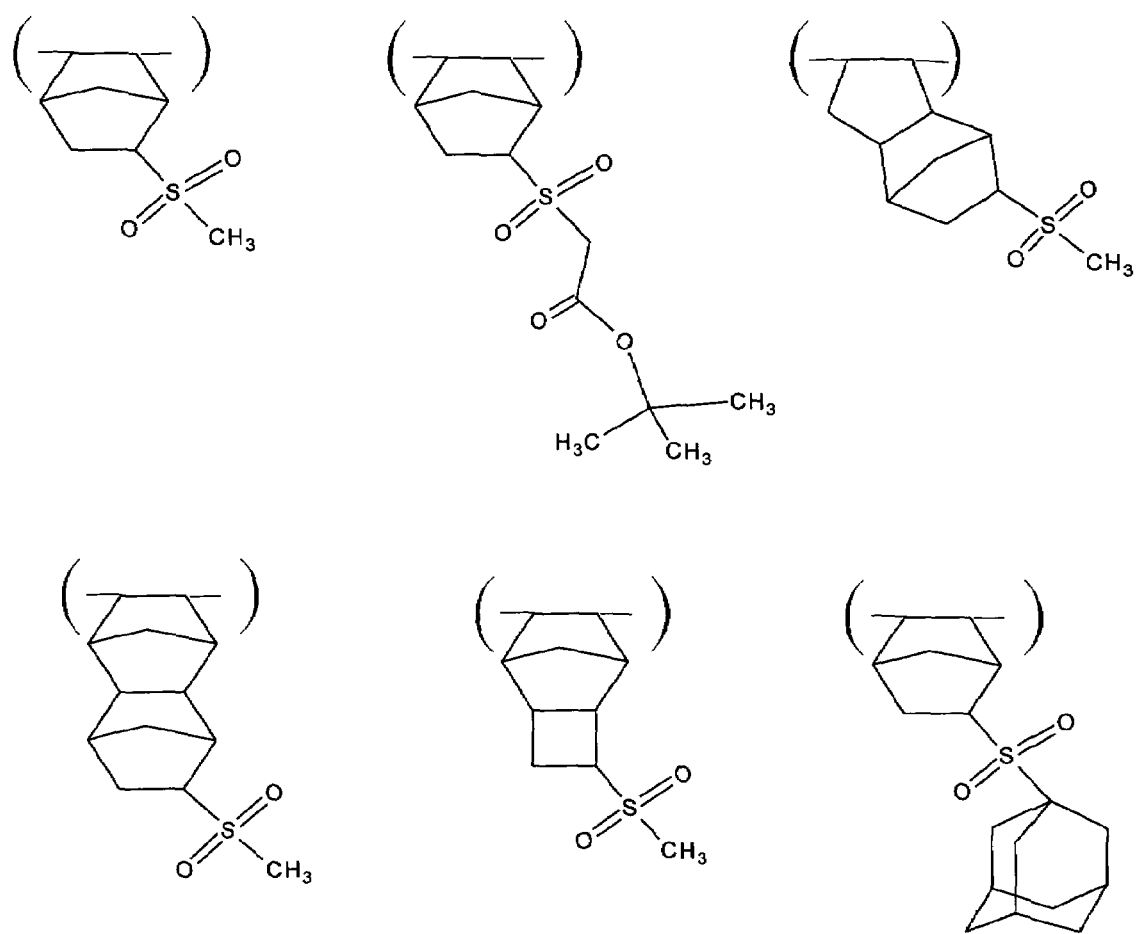
Figure 4 : Example of multicyclic units with sulfone groups

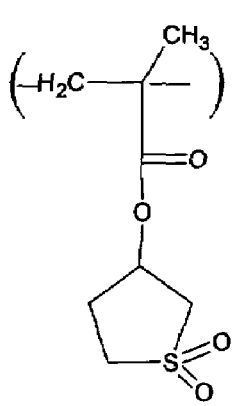
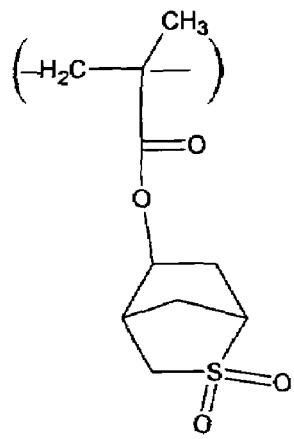
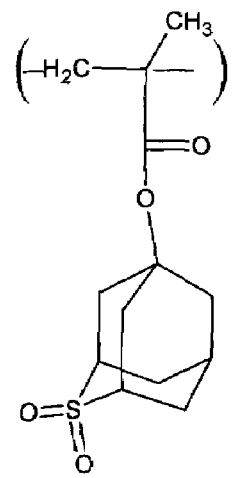
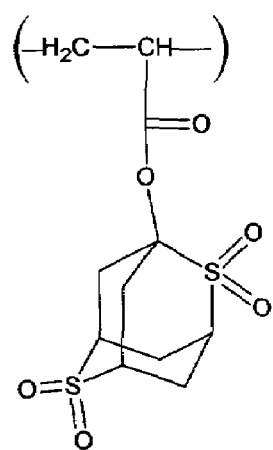
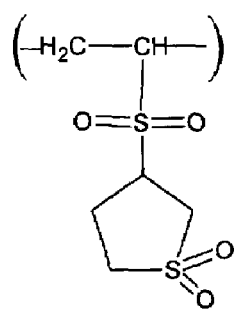
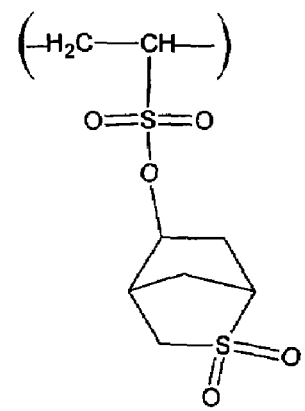
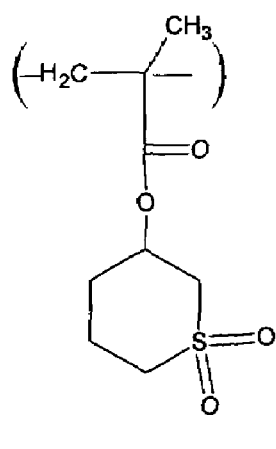
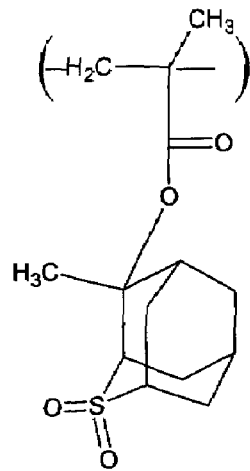
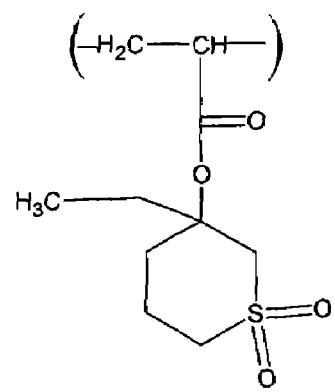
Figure 5: Examples of units with cyclic sulfone groups

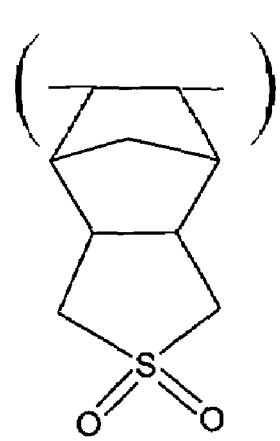
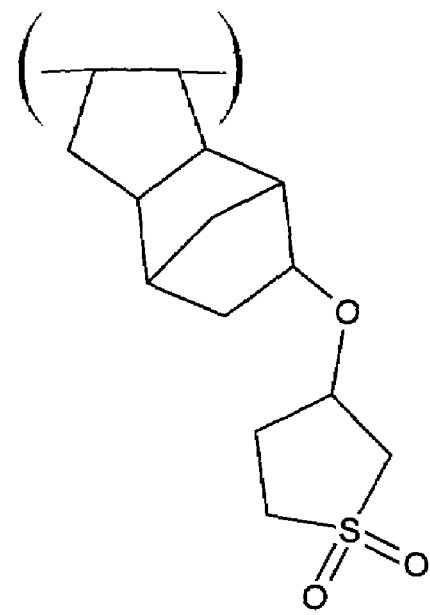
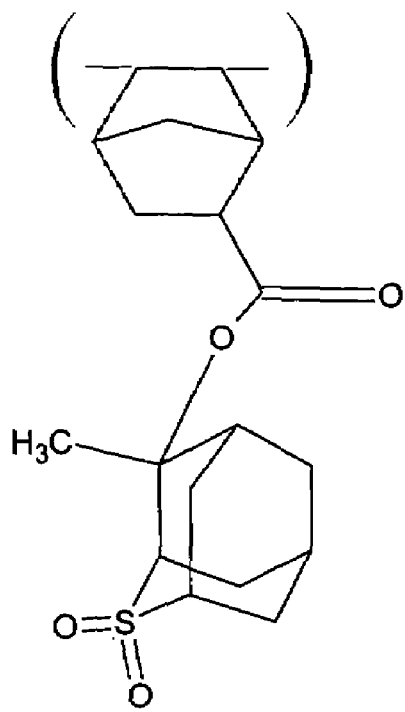
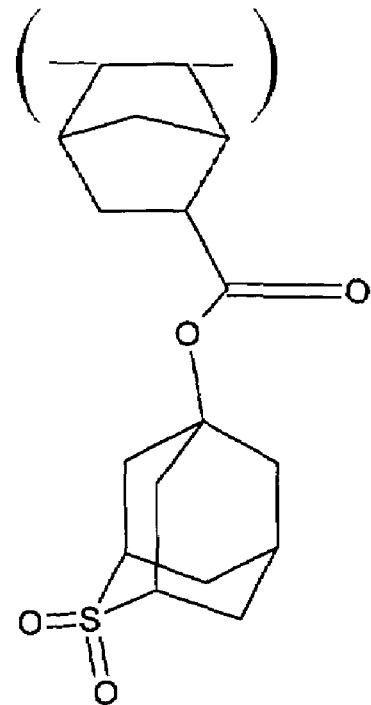
Figure 6: Examples of multicyclic units with cyclic sulfone groups

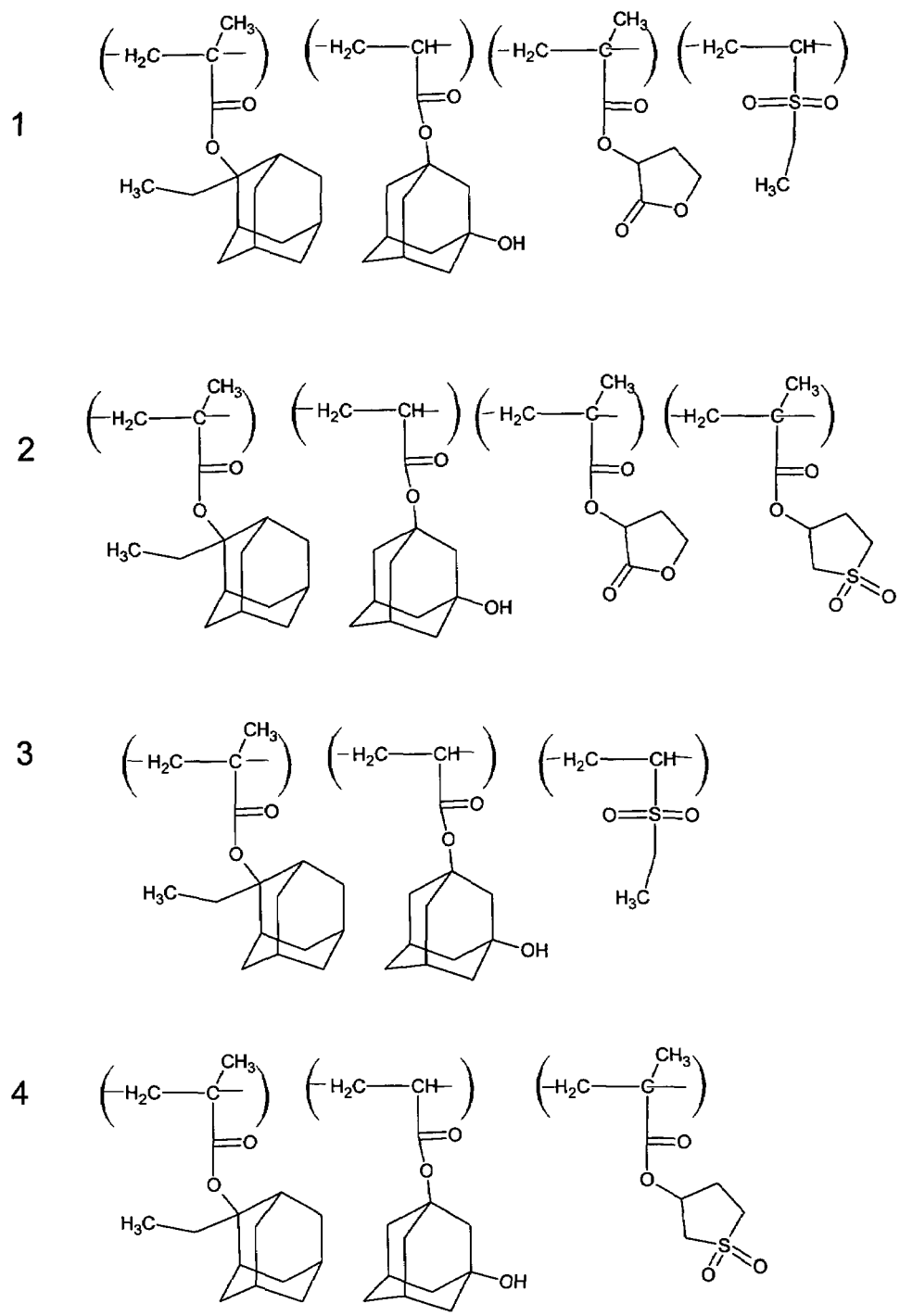
Figure 7: Example of polymers (1) – (4) containing various comonomeric units 5 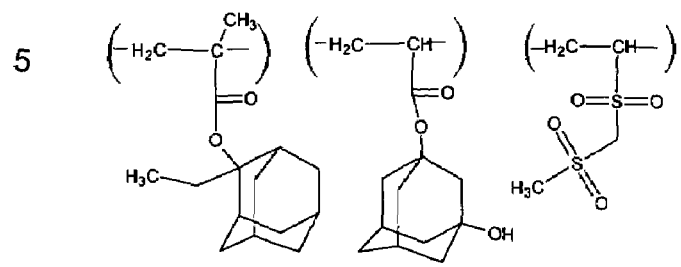
6 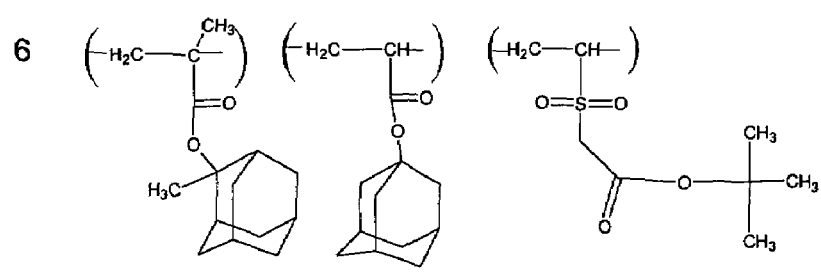
7 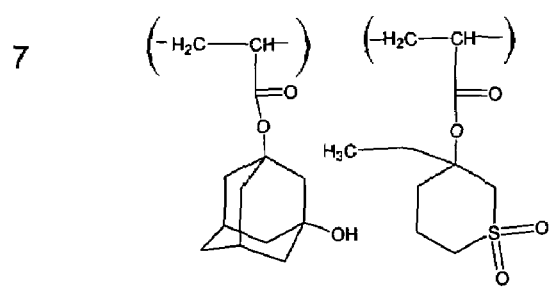
8 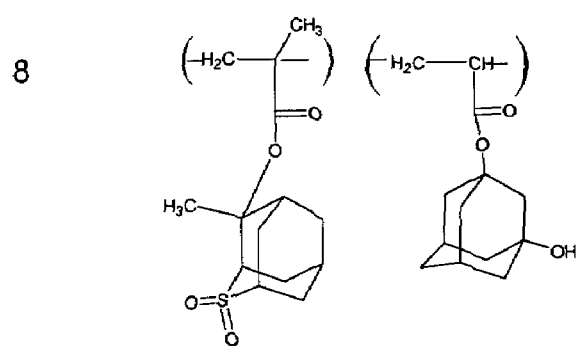
Figure 8: Example of polymers (5) – (8) containing various monomeric units 9 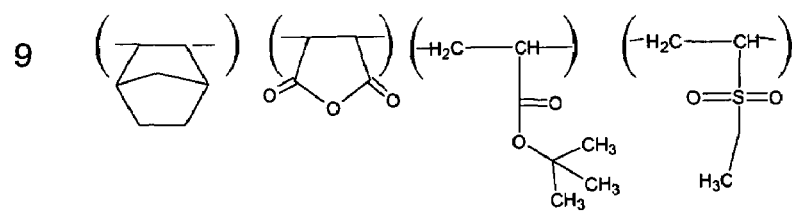
10 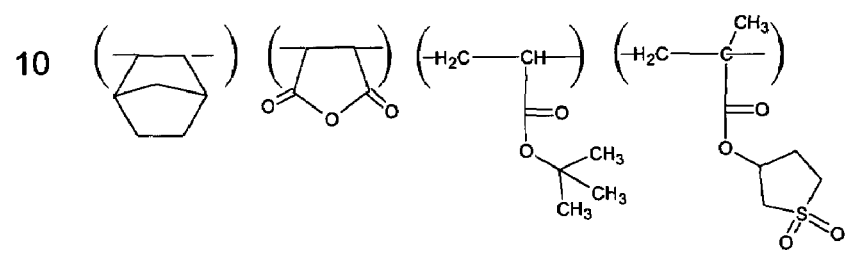
11 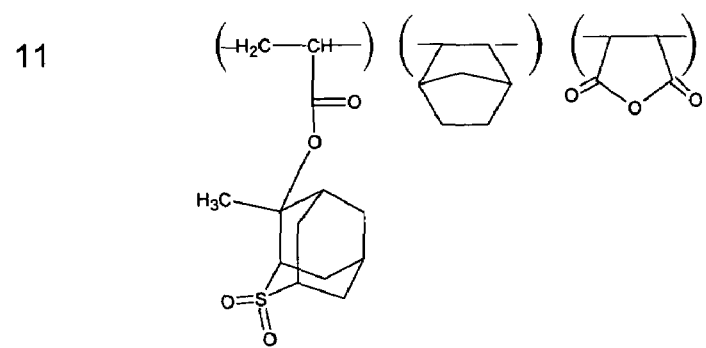
12 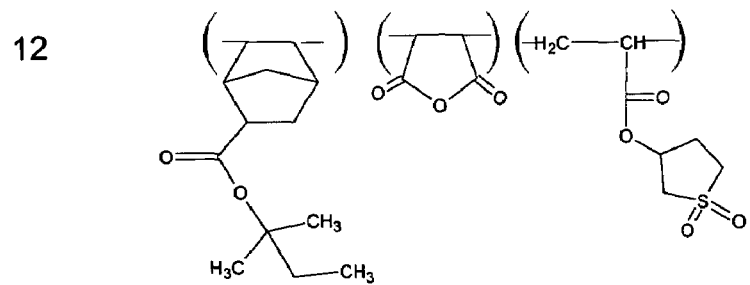
Figure 9: Examples of polymers (9) – (12) containing various monomeric units 13 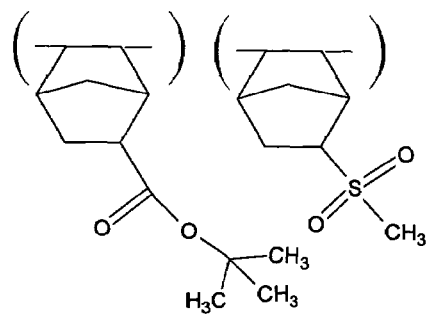
14 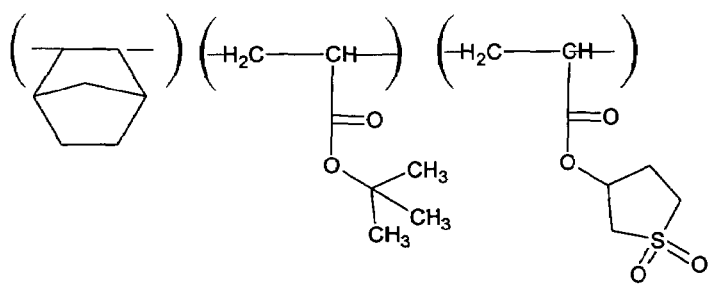
15 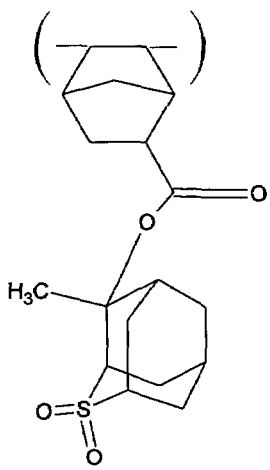  16 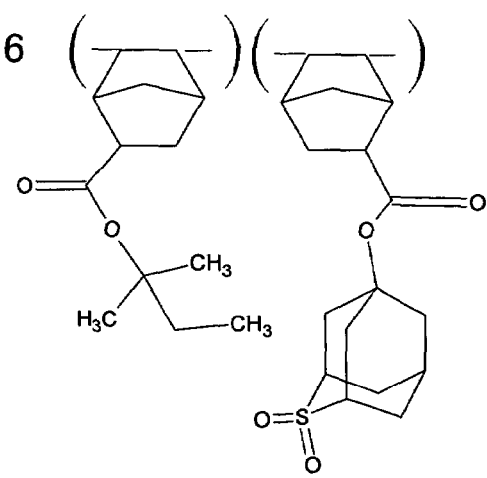
Figure 10: Examples of polymers (13) – (16) containing various monomeric units

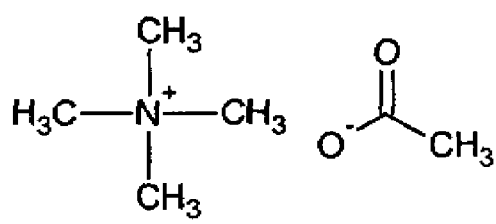 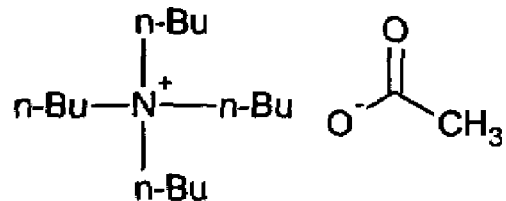
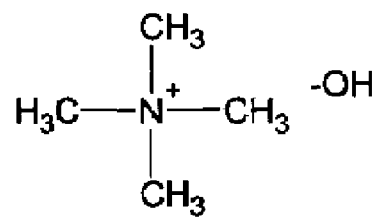 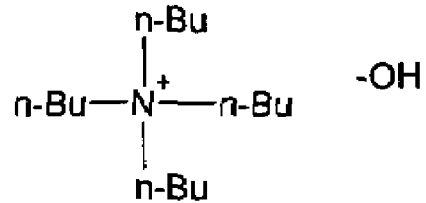
Figure 11: Examples of suitable ammonium bases.

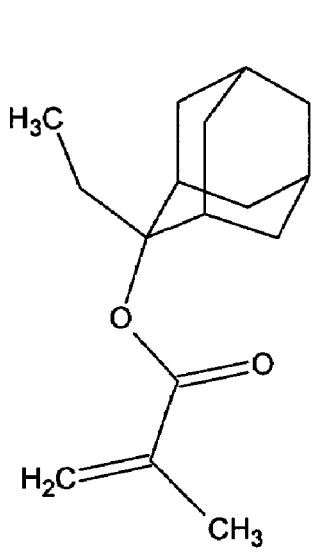
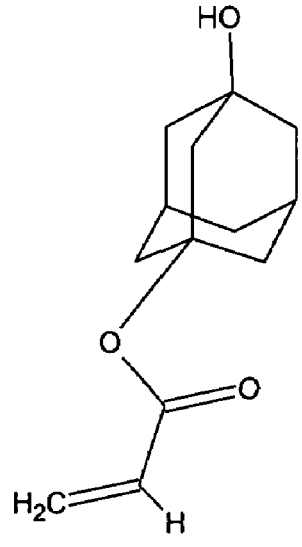
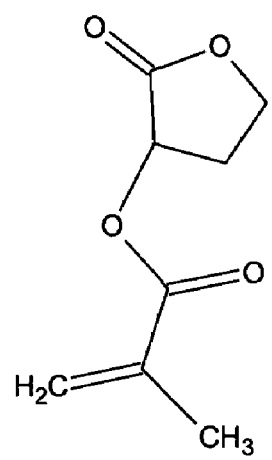
EAdMA
FW: 248.4
HAdA
F W: 222.3
a-GBLMA
F W: 170.2
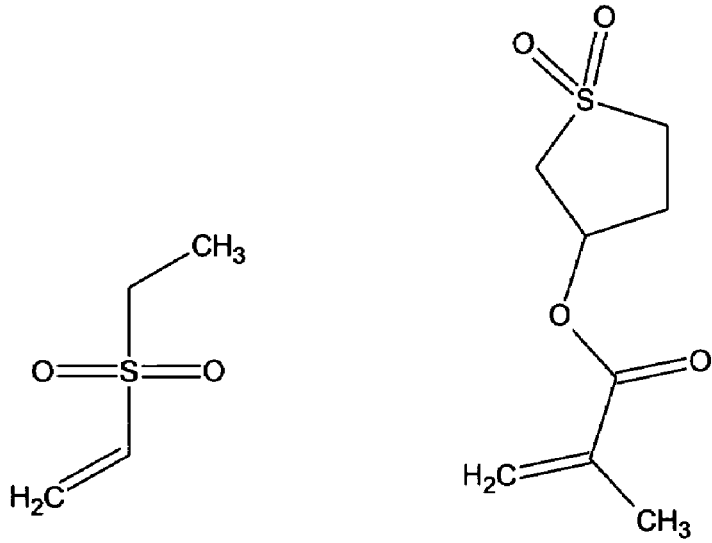
EVS
F W: 120.2
MA-THTDO
F W: 204.24
Figure 12: Structure of monomers used in the Examples Section

PHOTORESIST COMPOSITION FOR DEEP UV AND PROCESS THEREOF

FIELD OF INVENTION

The present invention relates to a novel polymer and a photoresist composition comprising the novel polymer which is sensitive to radiation in the deep ultraviolet, particularly a positive working photoresist sensitive in the range of 100-300 nanometers (nm). The present invention also relates to a process for imaging the photoresist composition of this invention.

BACKGROUND OF INVENTION

Photoresist compositions are used in microlithography processes for making miniaturized electronic components such as in the fabrication of computer chips and integrated circuits. Generally, in these processes, a thin coating of film of a photoresist composition is first applied to a substrate material, such as silicon wafers used for making integrated circuits. The coated substrate is then baked to evaporate any solvent in the photoresist composition and to fix the coating onto the substrate. The photoresist coated on the substrate is next subjected to an image-wise exposure to radiation.

The radiation exposure causes a chemical transformation in the exposed areas of the coated surface. Visible light, ultraviolet (UV) light, electron beam and X-ray radiant energy are radiation types commonly used today in microlithographic processes. After this image-wise exposure, the coated substrate is treated with a developer solution to dissolve and remove either the radiation exposed or the unexposed areas of the photoresist.

The trend towards the miniaturization of semiconductor devices has led to the use of new photoresists that are sensitive to lower and lower wavelengths of radiation and has also led to the use of sophisticated multilevel systems to overcome difficulties associated with such miniaturization. There are two types of photoresist compositions, negative-working and positive-working. When negative-working photoresist compositions are exposed image-wise to radiation, the areas of the resist composition exposed to the radiation become less soluble to a developer solution (e.g. a cross-linking reaction occurs) while the unexposed areas of the photoresist coating remain relatively soluble to such a solution. Thus, treatment of an exposed negative-working resist with a developer causes removal of the non-exposed areas of the photoresist coating and the creation of a negative image in the coating, thereby uncovering a desired portion of the underlying substrate surface on which the photoresist composition was deposited.

On the other hand, when positive-working photoresist compositions are exposed image-wise to radiation, those areas of the photoresist composition exposed to the radiation become more soluble to the developer solution (e.g. a rearrangement reaction occurs) while those areas not exposed remain relatively insoluble to the developer solution. Thus, treatment of an exposed positive-working photoresist with the developer causes removal of the exposed areas of the coating and the creation of a positive image in the photoresist coating. Again, a desired portion of the underlying surface is uncovered.

Photoresist resolution is defined as the smallest feature which the resist composition can transfer from the photomask to the substrate with a high degree of image edge acuity after exposure and development. In many manufacturing applications today, resist resolution on the order of less than one micron are necessary. In addition, it is almost always desirable that the developed photoresist wall profiles be near vertical relative to the substrate. Such demarcations between developed and undeveloped areas of the resist coating translate into accurate pattern transfer of the mask image onto the substrate. This becomes even more critical as the push toward miniaturization reduces the critical dimensions on the devices.

Photoresists sensitive to short wavelengths, between about 100 nm and about 300 nm can also be used where subhalfmicron geometries are required. Particularly preferred are photoresists comprising non-aromatic polymers, a photoacid generator, optionally a solubility inhibitor, and solvent.

High resolution, chemically amplified, deep ultraviolet (100-300 nm) positive and negative tone photoresists are available for patterning images with less than quarter micron geometries. Chemically amplified resists, in which a single photo generated proton catalytically cleaves several acid labile groups, are used in photolithography applicable to sub quarter-micron design rules. As a result of the catalytic reaction, the sensitivity of the resulting resist is quite high compared to the conventional novolak-diazonaphthoquinone resists. To date, there are three major deep ultraviolet (uv) exposure technologies that have provided significant advancement in miniaturization, and these are lasers that emit radiation at 248 nm, 193 nm and 157 nm. Examples of such photoresists are given in the following patents and incorporated herein by reference, U.S. Pat. No. 4,491,628, U.S. Pat. No. 5,350,660, and U.S. Pat. No. 5,843,624. Photoresists for 248 nm have typically been based on substituted polyhydroxystyrene and its copolymers. On the other hand, photoresists for 193 nm exposure require non-aromatic polymers, since aromatics are opaque at this wavelength. Generally, alicyclic hydrocarbons are incorporated into the polymer to replace the etch resistance lost by the absence of aromatics.

Photoresists based on chemical amplification mechanism are employed for 248 and 193 nm applications. However, the photoresist materials applicable for 248 nm cannot be used at 193 nm due to the high absorption of the poly (4-hydroxystyrene) based polymers used for 248 nm applications. 193 nm applications typically require non-aromatic compounds. Open-chain aliphatic resins cannot be used due to the very high etch rates of these materials. Polymers possessing annelated structures in the side chains such as tricyclododecyl and adamantane or cycloolefins in the main chain are shown to provide etch resistance close to poly(4-hydroxystyrene) polymers [Nakano et al. Proc. SPIE 3333, 43 (1998), Nozaki et al., Wallow et al. Proc. SPIE 3333, 92 (1998), and J. C. Jung et al. Proc. SPIE 3333, 11, (1998)].

Houlihan et al (U.S. Pat. No. 5,843,624), disclose a polymer for photoresist application, which is a polymer made from a cyclic olefin, maleic anhydride and a substituted or unsubstituted acrylate.

Comonomers containing lactone groups are disclosed in U.S. Pat. No. 6,447,980 and U.S. 2001/0044070. The present applicants have found that during processing conditions of the photoresists, the lactone group has a propensity for ring opening, which leads to crosslinking of the polymer. Thus there is a need to replace the lactone group with a more suitable group. The present applicants have also found that the replacement of the lactone group with the sulfone group can provide stability and improved hydrophilicity to the polymer, thus improving the lithographic performance of the photoresist. U.S. 2003/02196678 discloses fluorinated sulfone and sulfonated polymers for use as a 157 nm photoresist.

In another application of sulfone containing polymers it has been found that coatings of such polymers also possess high refractive index, In order to further improve the resolution and depth of focus of photoresists, immersion lithography is a technique that has recently been used to extend the resolution limits of deep uv lithography imaging. In the traditional process of dry lithography imaging, air or some other low refractive index gas, lies between the lens and the wafer plane. This abrupt change in refractive index causes rays at the edge of the lens to undergo total internal reflection and not propagate to the wafer. In immersion lithography a fluid is present between the objective lens and the wafer to enable higher orders of light to participate in image formation at the wafer plane. In this manner the effective numerical aperture of the optical lens (NA) can be increased to greater than 1, where $NA_{wet}=n_i \sin \theta$, where $NA_{wet}$ is the numerical aperture with immersion lithography, $n_i$ is refractive index of liquid of immersion and $\sin \theta$ is the angular aperture of the lens. Increasing the refractive index of the medium between the lens and the photoresist allows for greater resolution power and depth of focus. This in turn gives rise to greater process latitudes in the manufacturing of IC devices. The process of immersion lithography is described in 'Immersion liquids for lithography in deep ultraviolet' Switkes et al. Vol. 5040, pages 690-699, Proceedings of SPIE, and incorporated herein by reference. It is also desirable for photoresists useful in immersion lithography to have high refractive index. The present inventors have found that photoresist polymers containing pendant sulfone groups from the polymer backbone provide a polymer with high refractive index. The refractive index of the polymer is proportional to the sulfone content in the polymer.

The present invention relates to a chemically amplified system, which is sensitive to wavelengths between 300 nm and 100 nm, and comprises a) a novel polymer that is insoluble in an aqueous alkaline solution and comprises at least one acid labile group, and, b) a compound capable of producing an acid upon radiation. The novel polymer of the invention when formulated into a photoresist, provides a photoresist with superior lithographic properties. The present invention also relates to a photoresist comprising an alkali soluble polymer, a dissolution inhibitor and a compound capable of producing an acid upon radiation.

BRIEF DESCRIPTION OF DRAWINGS

FIG. 1 shows a generic structure for norbornene based monomers.

FIGS. 2-6 give examples of the sulfone containing monomeric unit.

FIGS. 7-10 exemplifies polymers (1) to (15) comprising the sulfone containing monomeric unit.

FIG. 11 gives examples of ammonium bases.

FIG. 12 shows structures of some of the monomers used in the Examples section.

SUMMARY OF INVENTION

The present invention relates to a novel chemically amplified photoresist, which is sensitive to wavelengths between 300 nm and 100 nm, and comprises a) a novel polymer comprising a sulfone group pendant from a polymer backbone that is insoluble in an aqueous alkaline solution and comprises at least one acidic moiety protected with an acid labile group, and b) a compound capable of producing an acid upon irradiation. The invention also relates to a process of imaging the novel positive photoresist composition. The invention further relates to a process of imaging a photoresist where the photoresist has a coating comprising the polymer of the present invention, particularly for immersion lithography. The invention also relates to a novel polymer comprising a sulfone group pendant from a polymer backbone. The invention further relates to a photoresist composition comprising a novel polymer comprising a sulfone group pendant from a polymer backbone and which is alkali soluble, a dissolution inhibitor and a photoacid generator.

The polymer of the invention is further described as shown in structure 1.

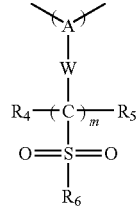

Structure 1 where,

A is a nonaromatic polymer backbone;

W is a single bond or a nonaromatic linking group;

m=0-10;

$R_4$ and $R_5$ are independently hydrogen, $(C_1-C_{18})$ alkyl, $SO_2R_7$, $C(O)R_7$, $(CH_2)_nSO_2R_7$, $(CH_2)_nCOR_7$, $(CH_2)_nOR_7$, $CO_2(CH_2)_nCO_2R_7$, $O(CH_2)_nCO_2R_7$, $(CH_2)_nCO_2R_7$, acidic moiety protected with an acid labile group, $R_4$ and $R_5$ are connected to form an unsubstituted or substituted alkyl cyclic structure, $R_4$ and $R_5$ are connected to form an unsubstituted or substituted alkyl cyclic structure containing within the cyclic structure sulfone, ether, carbonyl, carboxyl, and other hetero moieties, where $R_7$ is selected from $(CH_2)_nCN$, hydrogen, $(C_1-C_{18})$ linear, branched or cyclic alkyl, and acid labile group;

$R_6$ is independently $(C_1-C_{18})$ linear, branched or cyclic alkyl, acidic moiety protected with an acid labile group, $(CH_2)_nSO_2R_7$, $(CH_2)_nCOR_7$, $(CH_2)_nOR_7$, $(CH_2)_nCO_2R_7$, where $R_7$ is selected from $(CH_2)_nCN$, hydrogen, $(C_1-C_{18})$ linear, branched or cyclic alkyl, and acid labile group; and, optionally, $R_5$ and $R_6$ are connected to form an unsubstituted or substituted cyclic alkyl unit comprising a sulfone group; and, n=1-18.

DETAIL DESCRIPTION OF THE INVENTION

The present invention relates to a novel chemically amplified photoresist, which is sensitive to wavelengths between 300 nm and 100 nm, and comprises a) a novel polymer comprising a sulfone group that is insoluble in an aqueous alkaline solution and comprises at least one acid moiety protected with an acid labile group, and b) a compound capable of producing an acid upon irradiation. The novel polymer of the present invention comprises at least one unit with a sulfone group pendant from the polymer backbone. The invention also relates to a process of imaging the novel positive photoresist composition. The invention further relates to a process of imaging a photoresist where the photoresist has a coating comprising the polymer of the present invention, particularly for immersion lithography.

The polymer of the invention may be further described as shown in structure 1.

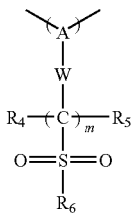

Structure 1 where,
A is a nonaromatic polymer backbone;
W is a single bond or a nonaromatic linking group;
m=0-10, preferably m=0-5;
$R_4$ and $R_5$ are independently hydrogen, ($C_1$-$C_{18}$, preferably $C_1$-$C_{10}$) alkyl, $SO_2R_7$, $C(O)R_7$, $(CH_2)_nSO_2R_7$, $CO_2(CH_2)_nCO_2R_7$, $O(CH_2)_nCO_2R_7$, $(CH_2)_nCO_2R_7$, $(CH_2)_nCOR_7$, $(CH_2)_nOR_7$, acidic moiety protected with acid labile group, $R_4$ and and $R_5$ are connected to form an unsubstituted or substituted alkyl cyclic structure, $R_4$ and $R_5$ are connected to form an unsubstituted or substituted alkyl cyclic structure containing within the cyclic structure sulfone, ether, carbonyl, carboxyl, and other hetero moieties, where $R_7$ is selected from $(CH_2)_n$ CN, hydrogen, ($C_1$-$C_{18}$, preferably $C_1$-$C_{10}$)linear, branched or cyclic alkyl, and acid labile group;

$R_6$ is independently ($C_1$-$C_{18}$, preferably, $C_1$-$C_{10}$) linear, branched or cyclic alkyl, acidic moiety protected with an acid labile group, $(CH_2)_nSO_2R_7$, $(CH_2)nCO_2R_7$, $(CH_2)_nCOR_7$, $(CH_2)_nOR_7$, where $R_7$ is selected from $(CH_2)_nCN$, hydrogen, ($C_1$-$C_{18}$, preferably $C_1$-$C_{10}$)linear, branched or cyclic alkyl, and acidic moiety protected with an acid labile group; and, optionally, $R_5$ and $R_6$ are connected to form an unsubstituted or substituted cyclic alkyl unit comprising a sulfone group; and,
n=1-18, preferably 1-10.

The polymer of the present invention comprises at least one unit of structure 1. The backbone of the polymer, unit A in structure 1, is derived from an aliphatic unsaturated or olefinic monomer, which may be linear or cyclic. Examples of monomers that can form the polymeric backbone are substituted or unsubstituted unsaturated compounds, which may be cyclic or linear.

The polymer backbone may be a substituted or unsubstituted ethylene chain derived from an unsaturated monomer, where the backbone unit is directly linked to the sulfone group or may be linked through another linking aliphatic moiety. In general, in one embodiment, the polymeric unit of structure 1 may be further defined by structure 2.

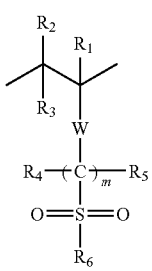

(2)

where,
$R_1$-$R_3$ are independently selected from hydrogen, cyano, ($C_1$-$C_{10}$) alkyl,
W is a single bond or a nonaromatic linking group;
m=0-10;
$R_4$ and $R_5$ are independently hydrogen, ($C_1$-$C_{18}$, preferably $C_1$-$C_{10}$) alkyl, $SO_2R_7$, $C(O)R_7$, $(CH_2)_nSO_2R_7$, $(CH_2)_nCOR_7$, $(CH_2)_nOR_7$, $CO_2(CH_2)_nCO_2R_7$, $O(CH_2)_nCO_2R_7$, $(CH_2)_nCO_2R_7$, acidic moiety protected with an acid labile group, $R_4$ and $R_5$ are connected to form an unsubstituted or substituted alkyl cyclic structure, $R_4$ and $R_5$ are connected to form an unsubstituted or substituted alkyl cyclic structure containing within the cyclic structure sulfone, ether, carbonyl, carboxyl, and other hetero moieties, where $R_7$ is selected from $(CH_2)_n$ CN, hydrogen, ($C_1$-$C_{18}$, preferably $C_1$-$C_{10}$)linear, branched or cyclic alkyl, and acid labile group;

$R_6$ is independently ($C_1$-$C_{18}$, preferably, $C_1$-$C_{10}$) linear, branched or cyclic alkyl, acidic moiety protected with acid labile group, $(CH_2)_nSO_2R_7$, $(CH_2)_nCOR_7$, $(CH_2)_nOR_7$, $(CH_2)nCO_2R_7$, where $R_7$ is selected from $(CH_2)_n$ CN, hydrogen, ($C_1$-$C_{18}$, preferably $C_1$-$C_{10}$)linear, branched or cyclic alkyl, and acid labile group; and, optionally, $R_5$ and $R_6$ are connected to form an unsubstituted or substituted cyclic alkyl unit comprising a sulfone group; and,
n=1-18, preferably 1-10.

In some embodiments it is preferable that the polymeric backbone unit A is derived from a monomer comprising an unsaturated cycloaliphatic moiety, which may be monocyclic or multicyclic. Examples of monocyclic groups are 5 to 8 membered, substituted or unsubstituted, carbon rings, and examples of multicyclic rings are bicyclic groups including substituted bicyclo[2.2.1]heptane, bicyclo[2.2.1]octane, bicyclo [2.2.2]octane, bicyclo [3.2.1]octane, bicyclo [3.2.2] nonane, and bicyclo [3.3.2]decane, and the like. Examples of tricyclic alkyl groups include tricyclo[5.4.0.0.$^{2,9}$]undecane, tricyclo[4.2.1.2.$^{7,9}$]undecane, tricyclo[5.3.2.0.$^{4,9}$]dodecane, and tricyclo[5.2.1.0.$^{2,6}$]decane. Typically multicyclic groups are those derived from cyclo olefins, especially norbornene based monomers, and examples of such multicyclic monomers that may be used to form the polymer of the present invention are represented in FIG. 1, where, in FIG. 1, $R_1$-$R_7$ are independently H, ($C_1$-$C_{12}$) alkyl, substituted or unsubstituted ether, ester and acid groups, but at least one of $R_1$-$R_6$ in FIG. 1 has the pendant functionality described in structure 3.

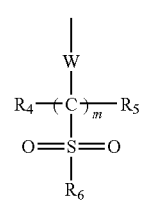

(3)

where,
$R_4$-$R_6$, are defined as in structure 1.

In the above definition and throughout the present specification, alkyl means linear and branched alkyl having the desirable number of carbon atoms and valence. Furthermore, alkyl also includes aliphatic cyclic groups, which may be monocyclic, bicyclic, tricyclic and so on. Suitable linear alkyl groups include methyl, ethyl, propyl, butyl, pentyl, etc.; branched alkyl groups include isopropyl, iso or tert butyl, branched pentyl, hexyl, octyl, etc; monocyclic alkyl groups include cyclopentyl, cyclohexyl and cycloheptyl; bicyclic alkyl groups include substituted bicyclo[2.2.1]heptane, bicyclo[2.2.1]octane, bicyclo [2.2.2]octane, bicyclo [3.2.1]octane, bicyclo [3.2.2]nonane, and bicyclo [3.3.2]decane, and the like. Examples of tricyclic alkyl groups include tricyclo [5.4.0.0.$^{2,9}$]undecane, tricyclo[4.2.1.2.$^{7,9}$]undecane, tricyclo [5.3.2.0.$^{4,9}$]dodecane, and tricyclo[5.2.1.0.$^{2,6}$]decane. As mentioned herein the cyclic alkyl groups may have any of the alkyl alkoxy, ester, hydroxyl, carbonyl or halo groups as substituents.

Other alkyl substituents or alkylene groups envisioned as being within the scope of this invention are divalent groups such as methylene, 1,1- or 1,2-ethylene, 1,1-, 1,2-, or 1,3 propylene and so on; a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein above.

The nonaromatic linking group, W, links the polymer backbone to the pendant sulfone group, and may be independently selected from a direct valence bond, aliphatic cyclic alkyl group, ester group, carboxyl group, $SO_2$, aliphatic linear or branched alkyl group, aliphatic cyclic alkyl group with a pendant ester group, carboxyl group, $SO_2$, CO, SO, O and S. More specifically, W, is exemplified by an alkyl (linear or branched) $C_1$-$C_{18}$ group, preferably $C_1$-$C_{10}$, cycloalkyl $C_5$-$C_{18}$ group, preferably $C_5$-$C_{12}$. In another case when m is not 0, W is selected from carbonyl (CO), carbonyloxy (C(O)—O), oxycarbonyl (O—C(O)), carbonate (O—C(O)—O), sulfone ($SO_2$), sulfoxide (SO), oxy (O) and sulfide (S).

The substituents in the polymer, $R_4$ and $R_5$ are independently hydrogen, ($C_1$-$C_{18}$, preferably $C_1$-$C_{10}$) alkyl, $SO_2R_7$, C(O)$R_7$, $(CH_2)_nSO_2R_7$, $CO_2(CH_2)_nCO_2R_7$, $O(CH_2)_nCO_2R_7$, $(CH_2)_nCO_2R_7$, $(CH_2)_nCOR_7$, $(CH_2)_nOR_7$, acidic moiety protected with acid labile group, $R_4$ and $R_5$ are connected to form an unsubstituted or substituted alkyl cyclic structure, $R_4$ and $R_5$ are connected to form an unsubstituted or substituted alkyl cyclic structure containing within the cyclic structure sulfone, ether, carbonyl, carboxyl, and other hetero moieties, where $R_7$ is selected from $(CH_2)_nCN$, hydrogen, ($C_1$-$C_{18}$, preferably $C_1$-$C_{10}$)linear, branched or cyclic alkyl, and acid labile group. The cyclic structure formed by connecting $R_4$ and $R_5$ may have pendant substituent groups exemplified by $SO_2R_7$, C(O)$R_7$, $(CH_2)_nSO_2R_7$, $CO_2(CH_2)_nCO_2R_7$, $O(CH_2)_nCO_2R_7$, $(CH_2)_nCO_2R_7$, $(CH_2)_nCOR_7$, $(CH_2)_nOR_7$, etc, where $R_7$ is selected from $(CH_2)_nCN$, hydrogen, ($C_1$-$C_{18}$, preferably $C_1$-$C_{10}$)linear, branched or cyclic alkyl, and acid labile group.

The sulfone group itself may be linked to the nonaromatic linking group, W, by an alkyl group $R_4(C)_mR_5$, where m=0-10, preferably m=0-5. When m=0, the sulfone group is linked directly to W.

In one embodiment the sulfone group may be directly attached to the polymer backbone, which is when m is zero and W is a single valence bond, as exemplified by structure 4. More specific examples of structure 4 are given in FIGS. 2, 3 and 4.

(4)

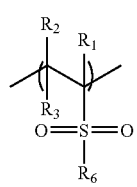

where,
$R_1$-$R_3$ and $R_6$ are as defined in structure 1 and 2.

In another embodiment of the unit of structure 1, the sulfone group is part of an aliphatic cyclic moiety. $R_5$ and $R_6$ can combine to form a cyclic unit comprising a sulfone group, for example a monocyclic or multicyclic unit, such as adamantane or norbornene group, where the sulfone group is the backbone of the cyclic structure. More than one sulfone group may form the backbone of a cyclic unit. Additionally, together with the sulfone there may be other groups that form the backbone or are pendant form the cyclic structure, such as O, CO, C(O)O, etc. Additional, nonlimiting examples of the unit of the polymer containing the sulfone group are given in FIGS. 5 and 6.

In another embodiment the units of structure 1-4 are free of fluorine substituents and fluorinated groups, since these groups tend to make the polymer hydrophobic.

Copolymers containing sulfone functionality have been found by the applicants to be less sensitive to acid induced ring opening under the influence of photoacid than polymers containing lactone functionality. Such ring openings in a positive chemically amplified resist system is undesirable because it can lead to negative tone behavior which may tend to degrade positive tone resolution capability. Moreover, the sulfone functionality is more hydrophilic than the lactone functionality, where greater hydrophilicity imparts improved performance to the photoresist. Hydrophilicity, or conversely hydrophobicity, can be measured by log P, where P is the partition coefficient between water and n-octanol. Log P may be measured experimentally or alternatively it may be calculated using commercial software packages such as ACD Log P available from www.acdlabs.com. Thus, polymers containing sulfone groups are relatively more hydrophilic than polymers containing lactone groups. Improvement in hydrophilicity for a given repeat unit can range from 6-9 Log P units. Thus a monomer repeat unit with a sulfone moiety will have a Log P that is typically 6-9 Log P units lower than that of a monomer with the same structure but with a $CH_2$ moiety instead of $SO_2$. Therefore, in smaller repeat units with sulfone groups, these will tend to be very hydrophilic, having Log P values which are negative. In larger repeat unit these may have Log P values larger than 0 but still substantially far smaller, and therefore much more hydrophilic, than the hydrocarbon analogs by 6-9 Log P units.

The refractive index of a coating of the sulfone containing polymer may be increased by increasing the concentration of the sulfone moiety in the polymer. For example, copolymers incorporating repeat units with multiple non-adjacent sulfone moieties (i.e. 2 or more different types of units of structure 1 or higher number of sulfone groups in one unit) may be used to achieve high refractive index coatings. Also, homopolymer of these sulfone containing repeat units, containing high content of sulfone moieties may also function by themselves as photoresist polymers as long as this repeat unit also incorporates in its structure an acidic moiety protected with an acid labile group. It was found by the applicants that coatings of sulfone containing copolymers gave higher refractive index than those containing lactone units. Photoresists comprising polymers with high refractive index and a photoactive compound are particularly useful for forming a coating of photoresist which is then imaged using immersion lithography.

The polymer useful as a photoresist may further comprise monomeric units other than those described by structure 1, providing at least one unit in the polymer comprises an acid labile unit. The photoresist polymer is insoluble or significantly insoluble in an aqueous alkali developer solution, but upon exposure becomes soluble in the developer. The comonomer units may be any units that impart suitable properties to the polymers and the photoresist derived from them.

Examples of different types of comonomers that may be used to form the photoresist polymer are without limitation, cyclic anhydrides, (meth)acrylate esters, nonaromatic cyclo olefins, and vinyl acetals. Some of the comonomers are described below.

Copolymers containing some amount of multicyclic aliphatic rings are preferred in the polymer, especially for imaging at 193 nm, since these rings are more resistant to dry etching than monocyclic rings. Typically multicyclic groups are those derived from cyclo olefins, especially norbornene based monomers, and examples of such multicyclic monomers that may be used to form the polymer of the present invention are represented in FIG. 1, where, in FIG. 1, $R_1$-$R_7$ are independently H, F, ($C_1$-$C_8$)alkyl, ($C_1$-$C_8$)fluoroalkyl, substituted or unsubstituted ether groups, ester groups or acid groups, acidic moiety protected with acid labile groups, and anhydride. Acid labile groups may be pendant from the multicyclic groups. Examples of comonomers useful for the copolymer of the present invention are 2-norbornene, 2-hydroxy-5-norbornene, 5-norbornene-2-carboxylic acid, methyl 5-norbornene-2-carboxylate, t-butyl 5-norbornene-2-carboxylate, 1-cyclohexyl-1-methylethyl 5-norbornene-2-carboxylate, 1-(4-methylcyclohexyl)-1-methylethyl 5-norbornene-2-carboxylate, 1-(4-hydroxylcyclohexyl)-1-methylethyl 5-norbornene-2-carboxylate, 1-methyl-1-(4-oxocyclohexyl)ethyl 5-norbornene-2-carboxylate, 1-(1-adamantyl)-1-methylethyl 5-norbornene-2-carboxylate, 1-methylcyclohexyl 5-norbornene-2-carboxylate, 2-methyl-2-adamantyl 5-norbornene-2-carboxylate, 2-ethyl-2-adamantyl 5-norbornene-2-carboxylate, 2-hydroxyl-1-ethyl 5-norbornene-2-carboxylate, 5-norbornene-2-methanol and 5-norbornene-2,3-dicarboxylic acid anhydride.

In another example of a comonomeric unit, the cyclic units may be pendant from an acrylate polymer backbone. Examples of acrylates and methacrylates are esters of acrylic and methacrylic acid, where the pendant group from the carboxylate is a substituted or unsubstituted adamantyl groups, acidic moiety protected with acid labile groups, and the like. Such comonomers are exemplified by 3-hydroxy-1-adamantyl acrylate, 3-hydroxy-1-adamantyl methacrylate, 3,5-dihydroxy-1-adamantyl acrylate and 3,5-dihydroxy-1-adamantyl methacrylate. Acrylate monomers that do not contain pendant cyclic groups may also be used, where the acrylates have pendant groups selected from alkyl groups, acidic moiety protected with acid labile groups, hydrogen, alkyloxyalkyl, ethers esters, etc.

More specific examples of cyclic anhydrides are maleic anhydride and itaconic anhydride.

Examples of vinyl acetals are acrolein diethyl acetal, acrolein dimethyl acetal, 2-vinyl-1,3-dioxalane, and acrolein ethylene acetal The polymer of the present invention comprises acidic moieties protected by an acid labile group. Any acidic moiety may be used, but may be exemplified by the following groups, where these moieties are particularly useful for $R_4$ and $R_5$:

1) carboxylic acid (p$K_a$ 6 or lower, e.g. $CO_2H$, ($C_1$-$C_{10}$) alkyl-$CO_2H$, ($C_1$-$C_{18}$) cycloalkyl-$CO_2H$, —$CO_2$—O—($CH_2$)$_n$$CO_2H$ (n=1-20), alkyl-$CO_2$—O—($CH_2$)$_n$$CO_2H$ (n=1-20), —O—($C_1$-$C_{18}$) cycloalkyl-$CO_2H$, —O—($C_1$-$C_{10}$) alkyl-$CO_2$—O—($CH_2$)$_n$$CO_2H$ (n=1-20), —C(fluoroalkyl)$_2$—O—($CH_2$)$_n$—$CO_2H$ (n=1-20);

2) acidic alcohol in which the alcohol is substituted by electron withdrawing groups to give it a p$K_a$ <10, for example, ($C_1$-$C_{10}$)alkyl-C(fluoroakyl)$_2$—O—($CH_2$)$_n$—$CO_2H$ (n=1-20) acidic alcohols (p$K_a$ 10 or lower eg—C(Fluoroakyl)$_2$OH, ($C_1$-$C_{10}$)alkyl-C(Fluoroakyl)$_2$OH and other beta-fluorinated fluoroalcohols where fluoroalkyl is linear or cyclic fluoroalkyl $C_1$-$C_{10}$, or other acid alcohols (pKa <10) activated by other electron withdrawing groups instead of fluoroalkyl groups eg CN, $SO_3R$, $CO_2R$ and the like where R is an alkyl group ($C_1$-$C_{10}$); and, 3) sulfamides (pKa 10 or lower eg ($C_1$-$C_{10}$)alkyl-$SO_2NH_2$, $SO_2NH$($C_1$-$C_{10}$)alkyl, ($SO_2$)$_2NH$, (alkyl$SO_2$)$_2NH$, ($C_1$-$C_{10}$) fluoroalkyl(—$SO_2NH_2$), etc.

The acidic moieties particularly useful for $R_6$ may be exemplified by the following groups:

1) carboxylic acid (p$K_a$ 6 or lower eg Alkyl-$CO_2H$, ($C_1$-$C_{10}$)cycloalkyl-$CO_2H$, —($C_1$-$C_{10}$)alkyl-$CO_2$—O—($CH_2$)$_n$$CO_2H$ (n=1-20), ($C_1$-$C_{18}$) cycloalkyl-$CO_2H$, (n=1-20), —C(fluoroakyl)$_2$—O—($CH_2$)$_n$—$CO_2H$ (n=1-20);

2) acidic alcohol in which the alcohol is substituted by electron withdrawing groups to give it a p$K_a$ <10, for example, ($C_1$-$C_{10}$)alkyl-C(fluoroakyl)$_2$—O—($CH_2$)$_n$—$CO_2H$ (n=1-20), acidic alcohols (p$K_a$ 10 or lower eg —($C_1$-$C_{10}$)C(fluoroakyl)$_2$OH, ($C_1$-$C_{10}$) alkyl-C(fluoroalkyl)$_2$OH and other beta-fluorinated fluoroalcohols where fluoroalkyl is linear or cyclic fluoroalkyl $C_1$-$C_{10}$, or other acid alcohols (pKa <10) activated by other electron withdrawing groups instead of a fluoroalkyl groups eg CN, $SO_2R$, $CO_2R$ and the like where R is an alkyl group ($C_1$-$C_{10}$); and, 3) sulfamides having pKa 10 or lower eg ($C_1$-$C_{10}$) alkyl-$SO_2NH_2$, ($C_1$-$C_{10}$) (alkyl$SO_2$)$_2NH$, ($C_1$-$C_{10}$)fluoroalkyl-$SO_2NH_2$), etc.

The acid moiety may be protected by any group capable of being cleaved by an acid. Examples of acid labile groups useful in this invention may be acetal protecting groups such as alkyloxyalkyl, such as methyloxymethyl, adamantylmethyloxymethyl, bicyclohexyloxymethyl, ethyloxymethyl, menthyloxymethyl, and cyclopentyloxymethyl. Acid labile group of the acetal type esters may be used, such as ethoxymethylester, 1-ethoxyethylester, 1-isobutoxyethylester, 1-isopropoxyethylester, 1-ethoxypropylester, 1-(2-methoxyethoxy)ethylester, 1-(2-acetoxyethoxy)ethylester, 1-[2-(1-adamantyloxy)ethoxy]ethylester, 1-[2-(1-adamantancarbonyloxy)ethoxy]ethylester, tetrahydro-2-furylester and tetrahydro-2-pyranylester, 2-alkyl-2-adamantyl, 1-adamantyl-1-alkylalkyl and alicyclic ester such as isobornylester, or acid cleaveable alkoxycarbonyl (e.g. tert-butoxycarboxyl, t-BOC), alkyleneoxyalkyl groups, trialkylsilyl, and 2-(trialkylsilyl)ethyl. Acid labile groups may be incorporated into any of the monomeric units of the polymer.

Hybrid polymers derived from the polymerization of substituted acrylates, substituted norbornenes, cyclic anhydrides, and the comonomer derived from structure 1 are one embodiment. Specific examples of polymers are those comprising structure 1 and at least one monomeric unit derived from a monomer selected from maleic anhydride, norbornene derivatives and (meth)acrylates, providing at least one monomer comprises an acid labile group.

Any number of comonomers may be used to give the desired lithographic properties. Typical comonomers are described and incorporated by reference in U.S. Pat. No. 5,843,624 and U.S. Pat. No. 6,447,980, providing at least one unit of structure 1 is present in the polymer.

Some non-limiting examples of copolymers (1)-(15) are shown in FIGS. 7, 8, 9 and 10.

The novel polymer may be a homopolymer of Structure 1 or a copolymer of Structure 1, where other monomeric units impart various desirable properties to the polymer. The polymer may also incorporate different monomers which are variations of structure 1.

In the embodiment where the photoresist comprises an alkali soluble polymer, a dissolution inhibitor and a photoacid generator, the polymer comprises the unit of structure 1, and other comonomer units that make the polymer base soluble. Examples of comonomers are (meth)acrylic acid, maleic anhydride, itaconic anhydride, 5-(2-trifluoromethyl-3,3,3-trifluoro-2-hydroxy)norborne, norbornecarboxylic acid, fumaric acid and the like. The polymer may also contain comonomers described previously, such norbornene derivatives and (meth)acrylates.

The polymers of this invention can be synthesized using techniques known in the art. The polymer of this invention, especially those that can be synthesized by free radical polymerization technique, may use for example, 2,2'-azobisisobutyronitrile (AIBN) as initiator. A mixture of monomers or the monomer of structure 1, is added to a reaction vessel together with a solvent, e.g. tetrahydrofuran, and AIBN is added. The reaction is carried out at a suitable temperature for a suitable amount of time to give a polymer with desired properties. The reaction may also be carried out without a solvent. The temperature may range from about 35° C. to about 150° C., preferably 50° C. to 90° C. for about 5 to 25 hours. The reaction may be carried out at atmospheric pressure or at higher pressures. It has been found that a reaction carried out under a pressure of from about 48,000 Pascals to about 250,000 Pascals gives a polymer with more consistent properties, where examples of such desirable properties are molecular weight, dark film loss, yield, etc. Dark film loss is a measure of the solubility of the unexposed photoresist film in the developing solution, and a minimal film loss is preferred. The polymer may be isolated from any suitable solvent, such as, diethyl ether, hexane or mixture of both hexane and ether. Other polymerization techniques may be used to obtain a polymer with the desired chemical and physical properties.

The alkali insoluble copolymer for the photoresist may comprise the unit of structure 1 at a level ranging from 5 mole % to 50 mole %, preferably 10 mole % to 40 mole %, and more preferably from 10 mole % to 30 mole %.

The polymer for a high refractive index photoresist may comprise the unit of structure 1 at a level ranging from 5 weight % to 100 weight %, and preferably from 5 weight % to 100 weight %.

Transparency of the polymers in a photoresist is an important requirement. Thus, the absorption coefficient of the resin film is less than 4/micron at the exposure wavelength, typically 193 nm, preferably 3/micron and more preferably less than 2/micron and even more preferably less than 1/micron.

It is preferred if the polymers employed in such formulations have a weight average molecular weight from about 1,000 to about 200,000, preferably from about 4,000 to about 20,000, more preferably from about 6,000 to about 14,000.

The compound capable of producing an acid upon irradiation, a photoacid generator (PAG), of the novel composition is selected from those which absorb at the desired exposure wavelength, preferably 193 nm and 157 nm. Suitable examples of the acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, and nitrobenzyl sulfonate esters, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluromethane sulfonate, triphenylsulfonium nonafluorobutane sulfonate and the like. Other compounds that form an acid upon irradiation that may be used, are triazines, oxazoles, oxadiazoles, thiazoles, substituted 2-pyrones. Phenolic sulfonic esters, bis-sulfonylmethanes, bis-sulfonylmethanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl) imide and their homologues are also possible candidates. Mixtures of photoactive compounds may also be used.

The photoresist of the present invention comprises the novel polymer, a photoacid generator, and optionally a base additive. In some cases bases or photoactive bases are added to the photoresist to control the profiles of the imaged photoresist and prevent surface inhibition effects, such as T-tops. Nitrogen containing bases are preferred, specific examples of which are amines, such as triethylamine, triethanolamine, aniline, ethylenediamine, pyridine, tetraalkylammonium hydroxide or its salts. Examples of photosensitive bases are diphenyliodonium hydroxide, dialkyliodonium hydroxide, trialkylsulfonium hydroxide, etc. The base may be added at levels up to 100 mole % relative to the photoacid generator. Although, the term base additive is employed, other mechanisms for removal of acid are possible, for instance by using tetraalkylammonium salts of volatile acids (eg. $CF_3CO_2^-$) or nucleophilic acids (eg $Br^-$), which respectively remove acid by volatilization out of the film during post-exposure bake or by reaction of a nucleophilic moiety with the acid precursor carbocation (e.g. reaction of tert-butyl carbocation with bromide to form t-butylbromide).

FIG. 11 shows the structures of ammonium derivatives which might be employed as bases.

The use of non volatile amine additives is also possible. Preferred amines would be ones having a sterically hindered structure so as to hinder nucleophilic reactivity while maintaining basicity, low volatility and solubility in the resist formulation, such as a proton sponge, 1,5-diazabicyclo[4.3.0]-5-nonene, 1,8-diazabicyclo[5,4,0]-7-undecene, cyclic akylamines, or polyether bearing amines such as described in U.S. Pat. No. 6,274,286.

Furthermore, it is within the scope of this invention that the photoresist further comprises dissolution inhibitors. Typically, dissolution inhibitors are added to the photoresist to decrease the dissolution rate of the unexposed photoresist in the developer. The dissolution inhibitors may be cholate esters, molecules containing phenolic groups partially or fully capped with acid labile groups, or other. More specific examples are tertiary butyl cholate, bis(4-(2'-tetrahydropyranyloxy)phenyl-)methane, bis(4-(2'-tetrahydrofuranyloxy)phenyl)methane, bis(4-tert-butoxyphenyl)methane, bis(4-tert-butoxycarbonyloxyphenyl)metha-ne, bis(4-tert-butoxycarbonylmethyloxyphenyl)methane, bis(4-(1'-ethoxyethoxy)phenyl)methane, bis(4-(1'-ethoxypropyloxy)phenyl)m-ethane, 2,2-bis(4'-(2"-tetrahydropyranyloxy)) propane, 2,2-bis(4'-(2"-tetrahydrofuranyloxy)phenyl) propane, 2,2-bis(4'-tert-butoxyphenyl)propane, 2,2-bis(4'-tert-butoxycarbonyloxyph-enyl)propane, 2,2-bis(4-tert-butoxycarbonylmethyloxyphenyl)propane, 2,2-bis(4'-(1"-ethoxyethoxy)phenyl)propane, 2,2-bis(4'-(1"-ethoxypropylox-y)phenyl)propane, tert-butyl 4,4-bis(4'-(2"-tetrahydropyranyloxy)phenyl)va-lerate, tert-butyl 4,4-bis(4'-(2"-tetrahydrofuranyloxy)phenyl)valerate, tert-butyl 4,4-bis(4'-tert-butoxyphenyl)valerate, tert-butyl 4,4-bis(4-tert-butoxycarbonyloxyphenyl)valerate, tert-butyl 4,4-bis(4'-tert-butoxycarbonylmethyloxyphenyl)valerate, tert-butyl 4,4-bis (4'-(1"-ethoxyethoxy)phenyl)valerate, tert-butyl 4,4-bis(4'-(1"-ethoxypropyloxy)phenyl)valerate, tris(4-(2'-tetrahydropyranyloxy)phenyl)methane, tris(4-(2'-tetrahydrofuranyloxy)phenyl)methane, tris(4-tertbutoxyphenyl)methane, tris(4-tert-butoxycarbonyloxyphenyl)met-hane, tris(4-tert-butoxycarbonyloxymethylphenyl)methane, tris(4-(1'-ethoxyethoxy)phenyl)methane, tris(4-(1'-ethoxypropyloxy)phenyl-)methane, 1,1,2-tris(4'-(2"-tetrahydropyranyloxy)phenyl)ethane, 1,1,2-tris(4'-(2"-tetrahydrofuranyloxy)phenyl)ethane, 1,1,2-tris(4'-tert-butoxyphenyl)ethane, 1,1,2-tris(4'-tert-butoxycarbonyl-oxyphenyl)ethane, 1,1,2-tris(4'-tert-butoxycarbonylmethyloxyphenyl)ethane, 1,1,2-tris(4'-(1'-ethoxyethoxy)phenyl)ethane, and 1,1,2-tris(4'-(1'-ethoxypropyloxy)phenyl)ethane. The dissolution inhibitor may be present in the photoresist solution at levels ranging from 0 weight % to about 50 weight %. In the embodiment where the polymer is alkali soluble, the dissolution inhibitor is present at levels ranging from 5 weight % to about 40 weight %.

The photoresist of the present invention may contain other components as additives, such as surfactants, dyes, and other secondary polymers.

The photoresist composition is formed by blending the ingredients in a suitable photoresist solvent. In the preferred embodiment, the amount of polymer in the photoresist preferably ranges from 90% to about 99.5% and more preferably from about 95% to about 99% based on the weight of the solid; i.e., non-solvent photoresist components. The photoresist may comprise a single polymer of the present invention or a mixture of polymers of the present invention comprising different types of unit of structure 1. Other secondary polymers that do not comprise the unit of structure 1 may also be present in the formulation and may be present at levels ranging from about 1 weight % to about 75 weight % of the polymer composition. In the preferred embodiment, the photoactive compound is present in the photoresist in an amount of from about 0.5% to about 10% preferably from about 4% to about 6% based on the weight of the solid photoresist components. In producing the photoresist composition, the solid components of the photoresist are mixed with a solvent or mixtures of solvents such as propylene glycol mono-alkyl ether, propylene glycol alkyl ether acetate, butyl acetate, xylene, 1,3-di(trifluoromethyl)benzene, ethylene glycol monoethyl ether acetate, propylene glycol mono-methyl ether acetate, 2-heptanone, ethyl lactate, ethyl-3-ethoxypropionate, and mixtures of ethyl lactate and ethyl-3-ethoxypropionate, among others.

The prepared photoresist composition solution can be applied to a substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include silicon, aluminum, polymeric resins, silicon dioxide, doped silicon dioxide, silicon nitride, tantalum, copper, polysilicon, ceramics, aluminum/copper mixtures; gallium arsenide and other such Group III/V compounds. The photoresist may also be coated over antireflective coatings.

The photoresist composition solution is then coated onto the substrate, and the substrate is treated at a temperature from about 70° C. to about 150° C. for from about 30 seconds to about 180 seconds on a hot plate or for from about 15 to about 90 minutes in a convection oven. This temperature treatment is selected in order to reduce the concentration of residual solvents in the photoresist, while not causing substantial thermal degradation of the solid components. In general, one desires to minimize the concentration of solvents and this first temperature treatment is conducted until substantially all of the solvents have evaporated and a thin coating of photoresist composition, on the order of half a micron (micrometer) in thickness, remains on the substrate. In a preferred embodiment the temperature is from about 95° C. to about 160° C., and more preferably from about 95° C. to about 135° C. The treatment is conducted until the rate of change of solvent removal becomes relatively insignificant. The temperature and time selection depends on the photoresist properties desired by the user, as well as the equipment used and commercially desired coating times. The coating substrate can then be imagewise exposed to actinic radiation, e.g., ultraviolet radiation, at a wavelength of from about 100 nm (nanometers) to about 300 nm, x-ray, electron beam, ion beam or laser radiation, in any desired pattern, produced by use of suitable masks, negatives, stencils, templates, etc.

The photoresist is then subjected to a post exposure second baking or heat treatment before development. The heating temperatures may range from about 90° C. to about 160° C., more preferably from about 100° C. to about 130° C. The heating may be conducted for from about 30 seconds to about 5 minutes, more preferably from about 60 seconds to about 90 seconds on a hot plate or about 15 to about 45 minutes by convection oven.

The exposed photoresist-coated substrates are developed to remove the image-wise exposed areas by immersion in a developing solution or developed by spray, puddle or spray-puddle development process. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides or supercritical carbon dioxide. One preferred developer is an aqueous solution of tetramethyl ammonium hydroxide. Surfactants may also be added to the developer composition. After removal of the coated wafers from the developing solution, one may conduct an optional post-development heat treatment or bake to increase the coating's adhesion and chemical resistance to etching conditions and other substances. The post-development heat treatment can comprise the baking of the coating and substrate below the coating's softening point or UV hardening process. In industrial applications, particularly in the manufacture of microcircuitry units on silicon/silicon dioxide-type substrates, the developed substrates may be treated with a buffered, hydrofluoric acid etching solution or preferably, dry etching. In some cases metals are deposited over the imaged photoresist.

In the embodiment where immersion lithography is used to expose the photoresist, the photoresist coating may optionally have a top coating to prevent contamination problems. The coating substrate can then be imagewise exposed to actinic radiation by immersion lithography, e.g., ultraviolet radiation, at a wavelength of from about 100 nm (nanometers) to about 450 nm, x-ray, electron beam, ion beam or laser radiation, in any desired pattern, produced by use of suitable masks, negatives, stencils, templates, etc. A typical immersion liquid used comprises water. Other additives may also be present in the immersion liquid.

Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

The chemical compounds referred to in the Examples are illustrated in FIG. 12.
The abbreviations for the chemical compounds are:
MA methacryloyl chloride
THTDO 3-hydroxy-1,1-dioxide-tetrahydrothiophene
EAdMA 2-ethyl-adamantan-2-yl methacrylate
HADA 3-hydroxy-adamantan-1-yl acrylate
GBLMA α-γ-butyrolactone methacrylate
EVS Ethyl vinyl sulfone

Example 1

Synthesis of MA-THTDO 9.2 g of methacryloyl chloride (1) was dissolved in 50 g tetrahydrofuran (THF). 10 g of 3-hydroxy-1,1-dioxide-tetrahydrothiophene (2) and 15 g of triethylamine (3) were dissolved in 150 g of THF. The solution of (1) was added drop wise into the solution mixture of (2) and (3) in ice/water bath with vigorous stirring. 2 hours after the addition was finished, the reaction was terminated by pouring the mixture into 800 ml water. 200 ml $CH_2Cl_2$ was used to extract the product. The $CH_2Cl_2$ solution was washed with 200 ml deionized water (DI) water twice. The $CH_2Cl_2$ solution then was dried using anhydrous $Na_2SO_4$. 40 mg 4-methoxy phenol was added into the $CH_2Cl_2$ solution. A dark orange product (MA-THTDO) was obtained after the solvent was removed by rotary evaporation below 40° C. The yield of the monomer was 65%.

Example 2

Polymer Synthesis
Poly(EAdMA/HADA/GBLMA/MA-THTDO)

21.86 g of EAdMA, 13.04 g of HADA, 19.97 g of a-GBLMA, 5.99 g of MA-THTDO and 9.13 g of AIBN were dissolved in 130 g THF. The temperature was raised to 70° C. and the reactants were mixed for 5 hours. The polymer was precipitated in MeOH twice and hexane once. The yield of the polymer was 52%. The weight average molecular weight ($M_w$) was 10,989, the polydispersity (PD) was 1.55, and the glass transition temperature (Tg) was 162° C.

Example 3

Polymer Synthesis
Poly(EAdMA/HADA/GBLMA/MA-EVS)

21.86 g of EAdMA, 13.04 g of HADA, 19.97 g of a-GBLMA, 3.53 g of EVS and 9.13 g of AIBN were dissolved in 130 g THF. The temperature was raised to 70° C. and the reaction was conducted for 5 h. The polymer was precipitate in MeOH twice and Hexane once. The yield was 48%. Mw=10,907, PD=1.48, Tg=138° C.

Example 4

Polymer Synthesis Poly(Ethylvinylsulfone)

10.00 grams of ethyl vinyl sulfone (0.082 moles) with 0.8068 g of AIBN (0.0133 moles) were placed in a pressure tube with at Teflon valve (a micro magnetic stirring bar was also placed in the tube with the components). The mixture was freeze/thawed under vacuum to remove oxygen three times using liquid nitrogen to freeze the contents of the tube. After the final freeze/thaw cycle, the tube was filled with nitrogen gas and the Teflon valve was sealed and the tube was place in a bath at 60° C. and stirred for 4 hours. During this time, the liquid became progressively more viscous, forming a stiff resin.

This resin was dissolved in 10 ml of dimethylformamide (DMF) and precipitated into 400 ml of methanol. The precipitate was filtered and dried in vacuum for 1.5 hours. The first precipitate was then dissolved in acetone (20 ml) and re-precipitated into 400 ml of methanol. The second precipitate was filtered and air dried for 1.5 hours and then dried overnight under vacuum at 40° C. In this manner 5.69 g of white powder polymer was recovered (yield 56.90%) with $M_w$=4245, PD=1.41, and Tg=123° C.

Example 5

Preparation of Spinning Solution and Forming Film for Ellipsometry Measurement

The polymer of Example 4 was dissolved into cyclohexanone to prepare a 7 wt % solution which was filtered through a 0.2 micron PTFE filter and spun onto a 4" silicon wafer at 500 rpm and baked at 130° C. for 1 min. In this manner a film having a thickness of 286 nm was formed which was measured on a Spectroscopic Ellipsometer (VUV-Vase VU-302). This material was found to have a refractive index at 193 nm of 1.71.

A photoresist is made by mixing the polymer of Example 4 (1.74 g) in PGMEA (18.7849 g), PGME (8.4600), a 1 wt % solution of 2,6-disoproplyaniline in PGMEA (0.4258 g), a 10 wt % solution of triphenylsulfonium nonaflate (TPSNf) in PGMEA (0.2927 g) a 10 wt % solution of (4-methoxy,3,5-dimethylphenyl)dimethylsulfonium nonaflate MPMSNf in PGMEA (0.2592 g) and a 10% solution of FC-4430 (Product of 3M Corp) in PGMEA (0.036 g). After mixing on a roller for 4 hours the sample is filtered with a 0.2 micron PTFE filter.

Comparative Example 6

Preparation of Spinning Solution and Film for Spectroscopic Ellipsometry Measurement Poly(tert-butylmethacrylate) (available from Polyscience Inc, . . . ) was dissolved in PGMEA as a 7 wt % solution and filtered through a 0.2 micron PTFE filter and spun onto a silicon wafer at 1700 rpm (60° C.) and baked at 100° C. for 1 min. In this manner a film having a thickness of 278 nm was formed which was measured on a Spectroscopic Ellipsometer (VUV-Vase VU-302). This material was found to have a refractive index at 193 nm of 1.61. Thus, the sulfone containing polymer of Example 4 gave a higher refractive index than the polymer of Example 6, which did not contain any sulfone.

Example 7

Photoresist Formulation with
Poly(EAdMA/HAdA/GBLMA/MA-THTDO)

The photoresist was prepared as follows:
Poly(EAdMA/HAdA/GBLMA/MA-THTDO) (Example 2) (1.74 g) was added to a 60 ml polyethylene bottle, and to this solid was added PGMEA (18.7849 g), PGME (8.4600), a 1 wt % solution of 2,6-disoproplyaniline in PGMEA (0.4258 g), a 10 wt % solution of triphenylsulfonium nonaflate (TPSNf) in PGMEA (0.2927 g) a 10 wt % solution of (4-methoxy,3,5-dimethylphenyl)dimethylsulfonium nonaflate MPMSNf in PGMEA (0.2592 g) and a 10% solution of FC-4430 (Product of 3M Corp) in PGMEA (0.036 g). After mixing on a roller for 4 hours the sample was filtered with a 0.2 micron PTFE filter.

Example 8

Photoresist Formulation with Poly(EAdMA/HAdA/GBLMA/MA-EVS)

The photoresist was prepared as follows:
Poly(EAdMA/HAdA/GBLMA/MA-EVS) (Example 3) (1.2570 g) was added to a 60 mL polyethylene bottle, and to this was added PGMEA (12.7515 g), PGME (5.61 g), a 1 wt % solution of 2,6-disoproplyaniline in PGMEA (0.3075 g), solid triphenylsulfonium nonaflate (TPSNf) (0.0212 g), solid (4-methoxy, 3,5-dimethylphenyl)dimethylsulfonium nonaflate MPMSNf. (0.0187 g) and a 10% solution of FC-4430 (fluoroaliphatic polymeric ester, supplied by 3M Corporation, St. Paul Minn.) in PGMEA (0.036 g). After mixing on a roller for 4 hours the sample was filtered with a 0.2 micron PTFE filter.

Lithographic Examples

Equipment Used for Coating and Patterned Exposures and Analysis

Exposures at 193 nm were done with a Nikon 193 nm scanner employing annular illumination; (NA=0.75 A0.50). The coating, bake and development processes were done on a TEL® ACT 12 track which was linked to the Nikon tool. Top Down SEM pictures were obtained with a KLA8100 CD-SEM: each data point was taken as the average of two measurement values. Critical dimensions were measured at 50% threshold with 20 nm offset.

Example 9

Processing of Photoresist from Example 7

A bottom antireflective coating with a film thickness of 37 nm, AZ® ArF™ 1C5D: (product from Clariant Corp. Somerville, N.J.), was coated onto a silicon substrate with a bake of 175° C. for 60 seconds. The photoresist from Example 7 was coated over the bottom antireflective coating (spin speeds 1923 rpm) and baked 115° C. 60 seconds) to give a film thickness of 210 nm. After imagewise exposure at 193 nm, the film was baked at 110° C. for 60 seconds followed by development in AZ®300 MIF Developer (0.26 N tetramethyl ammonium hydroxide (TMAH) for 30 seconds at 23° C.

In this manner Bright Field images at 28 mJ/cm$^2$ were seen for relaxed pitches (1:1.2 and 1:1.5) line/space (L/S) features with resolution starting from 0.1 microns maintained from down to 0.07 microns. Similarly, Bright Field images at 36 mJ/cm$^2$ were seen for 1:1 L/S features starting from 0.12 microns down to 0.085 microns. Finally, at 36 mJ/cm$^2$, isolated trenches 1:5(pitch) could be imaged down to 0.12 microns with partial opening of these features down to 0.1 microns.

Example 10

Processing of Photoresist from Example 8

A bottom antireflective coating with a film thickness of 37 nm, AZ® ArF™ 1C5D: (product from Clariant Corp. Somerville, N.J.), was coated onto a silicon substrate with a bake of 175° C. for 60 seconds. The resist of Example 8 was coated over the bottom antireflective coating (spin speeds 1697 rpm) and baked 110° C. 60 seconds) to give a film thickness of 210 nm. After imagewise exposure at 193 nm, the film was baked at 110° C. for 60 seconds, and followed by development in AZ®300 MIF Developer (0.26 N TMAH) for 60 seconds at 23° C. In this manner Bright Field images at 17.5 mJ/cm$^2$ were seen for relaxed pitches (1:1.2 and 1:1.5) L/S features with resolution starting from 0.1 microns and maintained down to 0.075 microns. Similarly, Bright Field images at 25 mJ/cm$^2$ were seen for 1:1 L/S features starting from 0.120 microns down to 0.08 microns. Finally, at 25 mJ/cm$^2$, isolated trenches 1:5 could be imaged down to 0.110 microns with partial opening at 0.1 microns.

What is claimed is:

1. A photoresist composition comprising a photoacid generator and a polymer comprising at least one unit as described by structure 1,

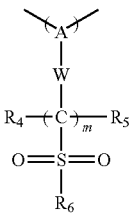

(1)

where, structure 1 is free of fluorination;
A is a nonaromatic polymer backbone;
W is a single bond or a nonaromatic linking group;
m is present and to 10; further,
either, $R_5$ and $R_6$ are connected to form a cyclic unit, and $R_4$ is independently hydrogen, $(C_1-C_{18})$ alkyl, $SO_2R_7$, $C(O)R_7$, $(CH_2)_nSO_2R_7$, $(CH_2)_nCOR_7$, $(CH_2)_nOR_7$, $CO_2$ $(CH_2)_nCO_2R_7$, $O(CH_2)_nCO_2R_7$, $(CH_2)_nCO_2R_7$, acidic moiety protected with an acid labile group, and where $R_7$ is selected from hydrogen, $(C_1-C_{18})$ linear, branched or cyclic alkyl, further where $R_5$ and $R_6$ are independently selected from $(C_1-C_{18})$ linear, branched or cyclic alkyl, $(CH_2)_nSO_2R_7$, $(CH_2)_nCOR_7$, $(CH_2)_nOR_7$, $(CH_2)$ $nCO_2R_7$, where $R_7$ is selected from $(C_1-C_{18})$ linear, branched or cyclic alkyl;
or, $R_5$ and $R_6$ are connected to form a cyclic unit and $R_4$ and $R_5$ are connected to form an alky cyclic structure, or $R_4$ and $R_5$ are connected to from an alkyl cyclic structure containing within the cyclic structure suflone, ether, carbonyl, and carboxyl moieties where $R_4$, $R_5$ and $R_6$ are independently selected from $(C_1-C_{18})$ linear, branched or cyclic alkyl, $(CH_2)_nSO_2R_7$, $(CH_2)_nCOR_7$, $(CH_2)_n$ $OR_7$, $(CH_2)nCO_2R_7$, where $R_7$ is selected from $(C_1-C_{18})$ linear, branched or cyclic alkyl; and
n=1-18.

2. The composition according to claim 1, where A is a cyclic unit selected from an aliphatic multicyclic unit and an aliphatic monocyclic unit.

3. The composition according to claim 1, where the unit of structure 1 is further described by structure 2

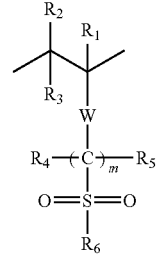

(2)

where,
structure 2 is free of fluorination,
$R_1$-$R_3$ are independently selected from hydrogen, cyano, and $(C_1-C_{10})$ alkyl,
W is a valence bond or a nonaromatic linking group;
m is present and to 10; further, either, $R_5$ and $R_6$ are connected to form a cyclic unit, and $R_4$ is independently hydrogen, $(C_1-C_{18})$ alkyl, $SO_2R_7$, $C(O)R_7$, $(CH_2)_nSO_2R_7$, $(CH_2)_nCOR_7$, $(CH_2)_nOR_7$, $CO_2(CH_2)_nCO_2R_7$, $O(CH_2)_nCO_2R_7$, $(CH_2)_nCO_2R_7$, acidic moiety protected with an acid labile group, and where $R_7$ is selected from hydrogen, $(C_1-C_{18})$ linear, branched or cyclic alkyl, further where $R_5$ and $R_6$ are independently selected from $(C_1-C_{18})$ linear, branched or cyclic alkyl, $(CH_2)_nSO_2R_7$, $(CH_2)_nCOR_7$, $(CH_2)_nOR_7$, $(CH_2)nCO_2R_7$, where $R_7$ is selected from $(C_1-C_{18})$ linear, branched or cyclic alkyl;

or, $R_5$ and $R_6$ are connected to form a cyclic unit and $R_4$ and $R_5$ are connected to form an alkyl cyclic structure, or $R_4$ and $R_5$ are connected to form an alkyl cyclic structure containing within the cyclic structure suflone, ether, carbonyl, and carboxyl moieties where $R_4$, $R_5$ and $R_6$ are independently selected from $(C_1-C_{18})$ linear, branched or cyclic alkyl, $(CH_2)_nSO_2R_7$, $(CH_2)_nCOR_7$, $(CH_2)_nOR_7$, $(CH_2)nCO_2R_7$, where $R_7$ is selected from $(C_1-C_{18})$ linear, branched or cyclic alkyl; and n=1-18.

4. The composition according to claim 2, where the cyclic unit of structure 1 is selected from those derived from the following monomers,

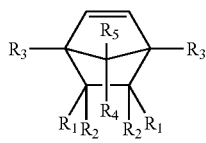

I

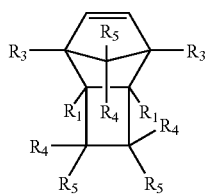

II

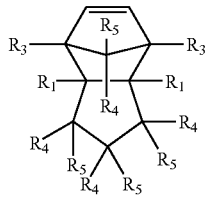

III

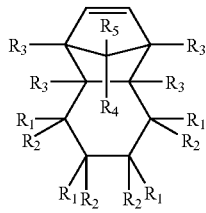

IV

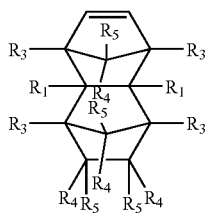

V

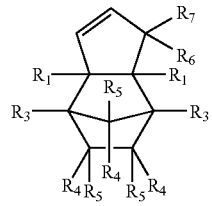

VI where, in the above structures, $R_1$-$R_7$ are independently H, $(C_1-C_8)$ alkyl, and at least one of $R_1$-$R_6$ forms the structure 3,

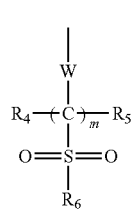

(3)

where,
structure 3 is free of fluorination,
W is a valence bond or a nonaromatic linking group;
m is present and to 5; further,
either, $R_5$ and $R_6$ are connected to form a cyclic unit, and $R_4$ is independently hydrogen, $(C_1-C_{18})$ alkyl, $SO_2R_7$, $C(O)R_7$, $(CH_2)_nSO_2R_7$, $(CH_2)_nCOR_7$, $(CH_2)_nOR_7$, $CO_2(CH_2)_nCO_2R_7$, $O(CH_2)_nCO_2R_7$, $(CH_2)_nCO_2R_7$, acidic moiety protected with an acid labile group, and where $R_7$ is selected from hydrogen, $(C_1-C_{18})$ linear, branched or cyclic alkyl, further where $R_5$ and $R_6$ are independently selected from $(C_1-C_{18})$ linear, branched or cyclic alkyl, $(CH_2)_nSO_2R_7$, $(CH_2)_nCOR_7$, $(CH_2)_nOR_7$, $(CH_2)nCO_2R_7$, where $R_7$ is selected from $(C_1-C_{18})$ linear, branched or cyclic alkyl;

or, $R_5$ and $R_6$ are connected to form a cyclic unit and $R_4$ and $R_5$ are connected to form an alkyl cyclic structure, or $R_4$ and $R_5$ are connected to form an alkyl cyclic structure containing within the cyclic structure suflone, ether, carbonyl, and carboxyl moieties where $R_4$, $R_5$ and $R_6$ are independently selected from $(C_1-C_{18})$ linear, branched or cyclic alkyl, $(CH_2)_nSO_2R_7$, $(CH_2)_nCOR_7$, $(CH_2)_nOR_7$, $(CH_2)nCO_2R_7$, where $R_7$ is selected from $(C_1-C_{18})$ linear, branched or cyclic alkyl; and n=1-18.

5. The composition according to claim 1, where W is selected from an aliphatic cyclic alkyl group, aliphatic linear or branched alkyl group, carbonyl (CO), carbonyloxy (C(O)—O), oxycarbonyl (O—C(O)), carbonate (O—C(O)—O), sulfone ($SO_2$), sulfoxide (SO), oxy (O) and sulfide (S), and aliphatic cyclic alkyl group with a pendant group selected from carbonyl (CO), carbonyloxy (C(O)—O), oxycarbonyl (O—C(O)), carbonate (O—C(O)—O), sulfone ($SO_2$), sulfoxide (SO), oxy (O) and sulfide (S)

6. The composition according to claim 1, where W is selected from a $(C_1-C_8)$ linear alkyl, $(C_1-C_8)$ branched alkyl, substituted monocycloalkyl, unsubstituted monocycloalkyl, substituted multicycloalkyl and unsubstituted multicycloalkyl.

7. The composition according to claim 1, where the polymer is a homopolymer.

8. The composition according to claim 1, where the polymer further comprises at least one comonomeric unit.

9. The composition according to claim 8, where the comonomeric unit is derived from monomers selected from cyclic anhydrides, (meth)acrylate esters, vinyl acetals and cycle olefins.

10. The process of imaging a positive photoresist composition comprising the steps of:
    a) coating a substrate with a film of photoresist composition of claim 1;
    b) baking the substrate to substantially remove the solvent;
    c) imagewise irradiating the photoresist film;
    d) baking the photoresist film; and,
    e) developing the irradiated photoresist film using an alkali developer.

11. The photoresist composition according to claim 10, further comprising coating an antireflective film on the substrate prior to coating the photoresist.

12. The process of claim 10, further where the photoresist film is sensitive at 193 nm.

13. The process of claim 10, wherein the photoresist film is imagewise irradiated using immersion lithography.

14. The process of claim 10, wherein the photoresist film is imagewise irradiated with light of wavelength in the range of 100 nm to 300 nm.

15. The process of claim 10, wherein the heating in step d) ranges from a temperature of from about 90° C. to about 150° C. for from about 30 seconds to about 180 seconds on a hot plate.

16. The process of claim 10, wherein the alkali developer comprises an aqueous solution of tetramethyl ammonium hydroxide.

17. A polymer comprising at least one unit as described by structure 1,

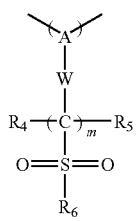

(1)

where, the polymer comprises at least one acid labile group and structure 1 is free of fluorination, and where,
A is a nonaromatic polymer backbone;
W is a single bond or a nonaromatic linking group;
m is present and to 10; further,
either, $R_5$ and $R_6$ are connected to form a cyclic unit, and $R_4$ is independently hydrogen, ($C_1$-$C_{18}$) alkyl, $SO_2R_7$, $C(O)R_7$, $(CH_2)_nSO_2R_7$, $(CH_2)_nCOR_7$, $(CH_2)_nOR_7$, $CO_2$ $(CH_2)_nCO_2R_7$, $O(CH_2)_nCO_2R_7$, $(CH_2)_nCO_2R_7$, acidic moiety protected with an acid labile group, and where $R_7$ is selected from hydrogen, ($C_1$-$C_{18}$) linear, branched or cyclic alkyl, further where $R_5$ and $R_6$ are independently selected from ($C_1$-$C_{18}$) linear, branched or cyclic alkyl, $(CH_2)_nSO_2R_7$, $(CH_2)_nCOR_7$, $(CH_2)_nOR_7$, $(CH_2)nCO_2R_7$, where $R_7$ is selected from ($C_1$-$C_{18}$) linear, branched or cyclic alkyl;
or, $R_5$ and $R_6$ are connected to form a cyclic unit and $R_4$ and $R_5$ are connected to form an alkyl cyclic structure, or $R_4$ and $R_5$ are connected to form an alkyl cyclic structure containing within the cyclic structure suflone, ether, carbonyl, and carboxyl moieties where $R_4$, $R_5$ and $R_6$ are independently selected from ($C_1$-$C_{18}$) linear, branched or cyclic alkyl, $(CH_2)_nSO_2R_7$, $(CH_2)_nCOR_7$, $(CH_2)_nOR_7$, $(CH_2)nCO_2R_7$, where $R_7$ is selected from ($C_1$—$C_{18}$) linear, branched or cyclic alkyl; and
n=1-18.

18. The polymer according to claim 17, where A is selected from at least one of an aliphatic multicyclic unit, an aliphatic monocyclic unit, a substituted ethylene unit and an unsubstitued ethylene unit.

19. A photoresist composition comprising a photoacid generator and a polymer, where the polymer comprises at least one unit selected from

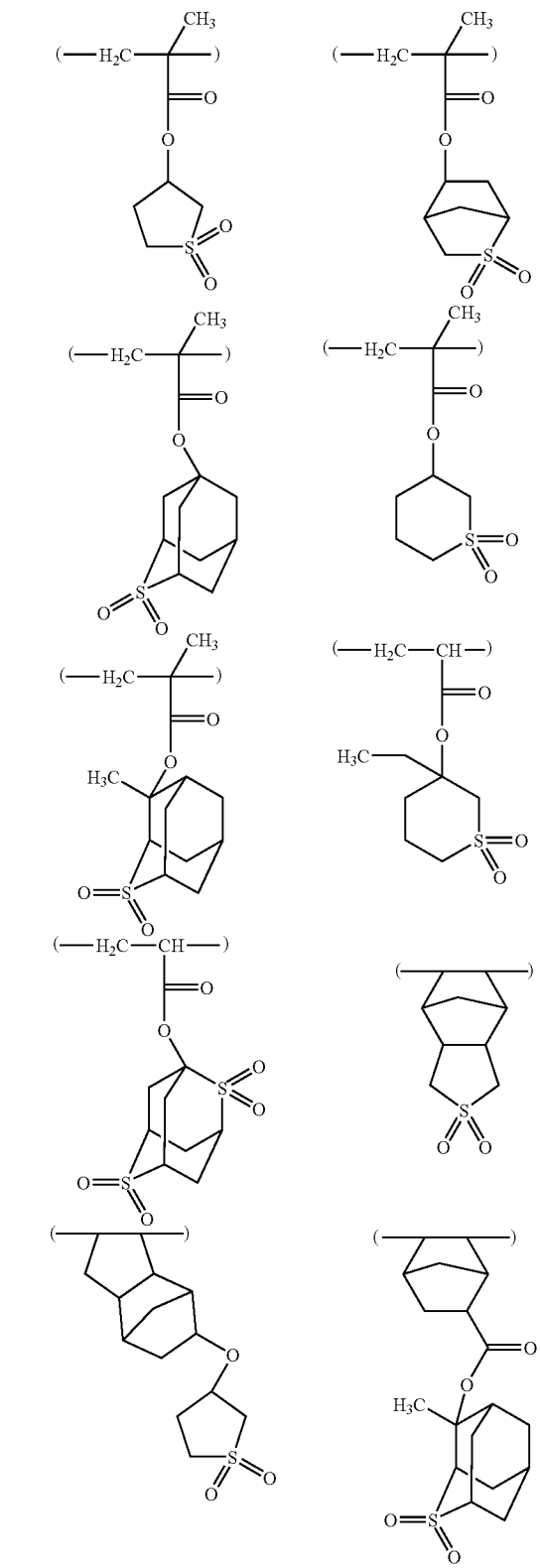

-continued

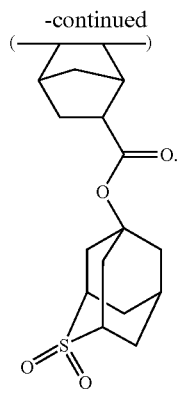

20. A photoresist composition comprising a photoacid generator and polymer consisting of a unit as described by structure 1 and at least one comonomeric unit derived from monomers of vinyl acetals, and where structure 1 is,

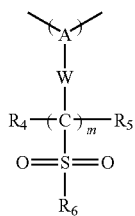
(1)

where, the structure 1 is free of fluorination,

A is a nonaromatic polymer backbone;

W is a single bond or a nonaromatic linking group;

m=0-10;

$R_4$ and $R_5$ are independently hydrogen, ($C_1$-$C_{18}$) alkyl, $SO_2R_7$, $C(O)R_7$, $(CH_2)_nSO_2R_7$, $(CH_2)_nCOR_7$, $(CH_2)_nOR_7$, $CO_2(CH_2)_nCO_2R_7$, $O(CH_2)_nCO_2R_7$, $(CH_2)_nCO_2R_7$, acidic moiety protected with an acid labile group, $R_4$ and $R_5$ may be connected to form an unsubstituted or substituted alky cyclic structure, $R_4$ and $R_5$ may be connected to form an unsubstituted or substituted alkyl cyclic structure containing within the cyclic structure sulfone, ether, carboxyl, and other hetero moieties, where $R_7$ is selected from $(CH_2)_nCN$, hydrogen, ($C_1$-$C_{18}$) linear, branched or cyclic alkyl, and acidic moiety protected with acid labile group;

$R_6$ is independently ($C_1$-$C_{18}$) linear, branched or cyclic alkyl, $(CH_2)_nSO_2R_7$, $(CH_2)_nCOR_7$, $(CH_2)_nOR_7$, $(CH_2)nCO_2R_7$ where $R_7$ is selected from ($C_1$-$C_{18}$) linear, branched or cyclic alkyl, and acid labile group; and, optionally, $R_5$ and $R_6$ are connected to form an unsubstituted or substituted cyclic alkyl unit comprising a sulfone group; and, n=1-18.

* * * * *